(12) United States Patent
Ouyang et al.

(10) Patent No.: US 11,201,060 B2
(45) Date of Patent: Dec. 14, 2021

(54) STRUCTURE AND FORMATION METHOD OF SEMICONDUCTOR DEVICE WITH METAL GATE STACK

(71) Applicant: Taiwan Semiconductor Manufacturing Co., Ltd., Hsinchu (TW)

(72) Inventors: Christine Y Ouyang, Hsinchu (TW); Ziwei Fang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/386,519

(22) Filed: Apr. 17, 2019

(65) Prior Publication Data

US 2020/0335346 A1 Oct. 22, 2020

(51) Int. Cl.
*H01L 21/28* (2006.01)
*H01L 21/311* (2006.01)
*H01L 21/02* (2006.01)
*H01L 21/31* (2006.01)
*H01L 21/32* (2006.01)
*H01L 21/8234* (2006.01)
*H01L 21/768* (2006.01)
*H01L 21/8238* (2006.01)
*H01L 29/66* (2006.01)
*H01L 29/423* (2006.01)
*H01L 29/78* (2006.01)

(52) U.S. Cl.
CPC .. *H01L 21/28158* (2013.01); *H01L 29/42392* (2013.01); *H01L 29/6653* (2013.01); *H01L 29/6681* (2013.01); *H01L 29/66553* (2013.01); *H01L 29/7854* (2013.01); *H01L 21/0206* (2013.01); *H01L 21/31127* (2013.01)

(58) Field of Classification Search
CPC ................. H01L 21/823821; H01L 21/28158
See application file for complete search history.

(56) References Cited

U.S. PATENT DOCUMENTS

| | | | |
|---|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |

(Continued)

*Primary Examiner* — Omar F Mojaddedi
(74) *Attorney, Agent, or Firm* — Birch, Stewart, Kolasch & Birch, LLP

(57) ABSTRACT

Structures and formation methods of a semiconductor device structure are provided. The method includes forming a dummy gate stack over a semiconductor substrate and forming a spacer element over a sidewall of the dummy gate stack. The method also includes removing the dummy gate stack to form a recess exposing a semiconductor strip and forming an inhibition layer over an interior surface of the spacer element. The method further includes forming a gate dielectric layer in the recess to selectively cover the semiconductor strip. The inhibition layer substantially prevents the gate dielectric layer from being formed on the inhibition layer. In addition, the method includes forming a metal gate electrode over the gate dielectric layer.

20 Claims, 38 Drawing Sheets

(56) References Cited

U.S. PATENT DOCUMENTS

| | | | |
|---|---|---|---|
| 9,536,980 B1* | 1/2017 | Huang | H01L 21/76877 |
| 9,576,814 B2 | 2/2017 | Wu et al. | |
| 9,608,116 B2 | 3/2017 | Ching et al. | |
| 2012/0313170 A1* | 12/2012 | Chang | H01L 29/66545 |
| | | | 257/347 |
| 2013/0105918 A1* | 5/2013 | Mieno | H01L 21/02181 |
| | | | 257/410 |
| 2016/0240652 A1* | 8/2016 | Ching | H01L 21/823412 |

* cited by examiner

STRUCTURE AND FORMATION METHOD OF SEMICONDUCTOR DEVICE WITH METAL GATE STACK

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
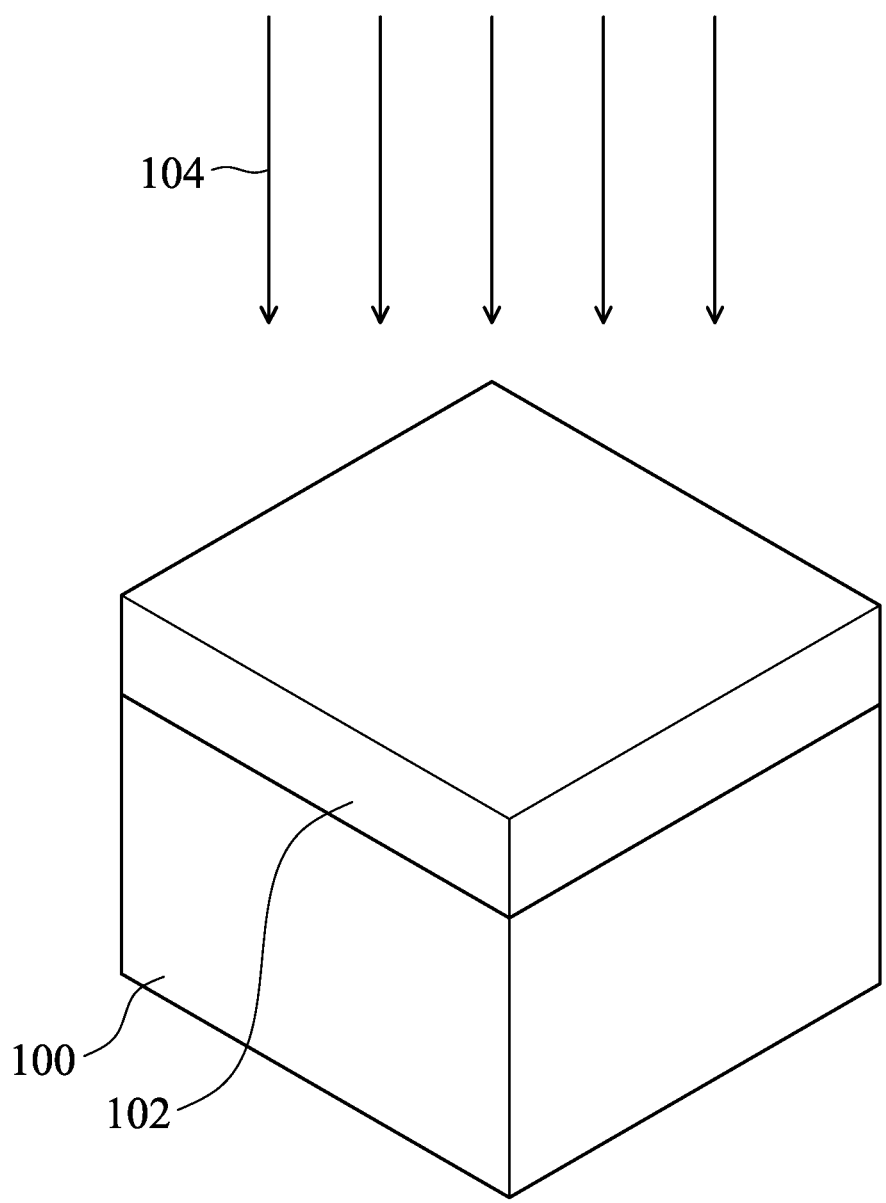
FIGS. 1A-1O are perspective views of various stages of a process for forming a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

Embodiments of the disclosure may relate to FinFET structure having fins. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. However, the fins may be formed using one or more other applicable processes.

Embodiments of the disclosure may relate to the gate all around (GAA) transistor structures. The GAA structure may be patterned by any suitable method. For example, the structures may be patterned using one or more photolithography processes, including double-patterning or multi-patterning processes. In some embodiments, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Figure 1B:
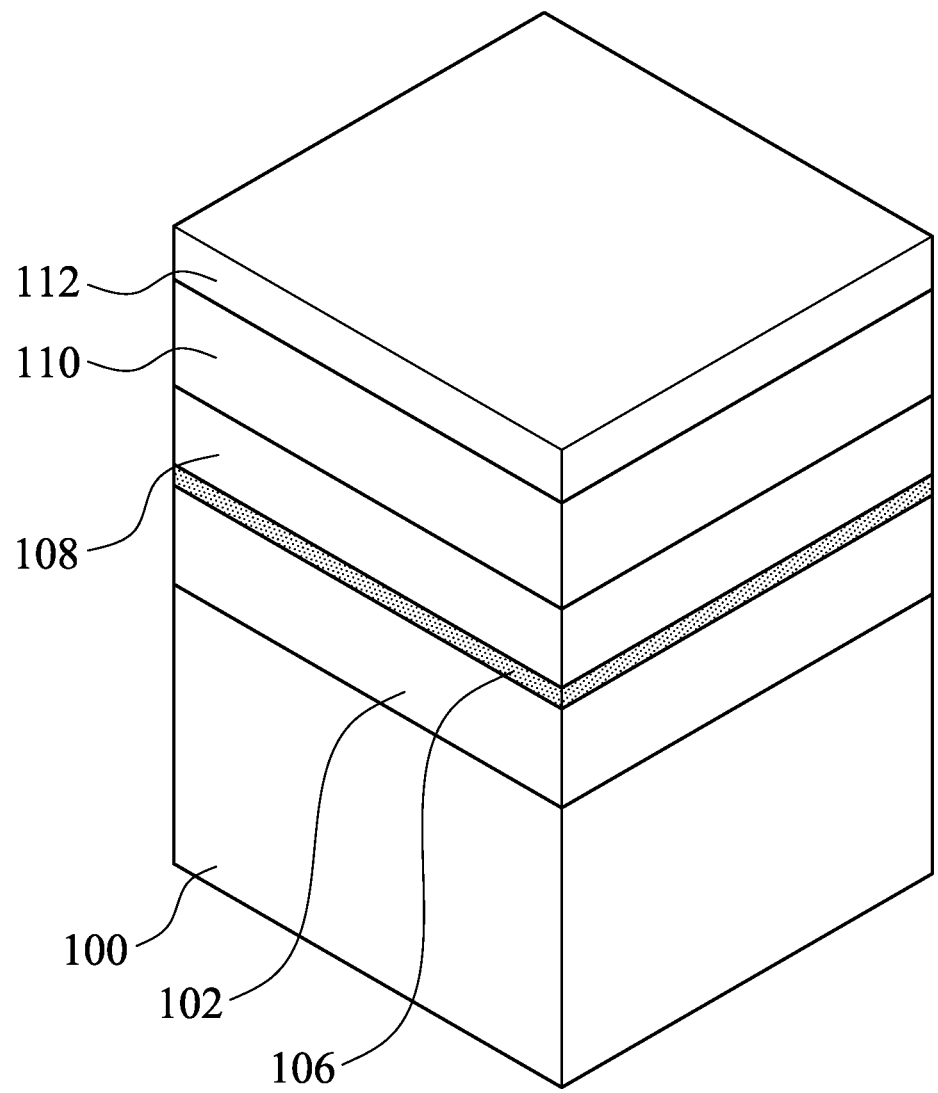
FIGS. 1G-1 to 1N-1 are cross-sectional views of various stages of a process for forming a semiconductor device structure, in accordance with some embodiments.
Figure 1C:
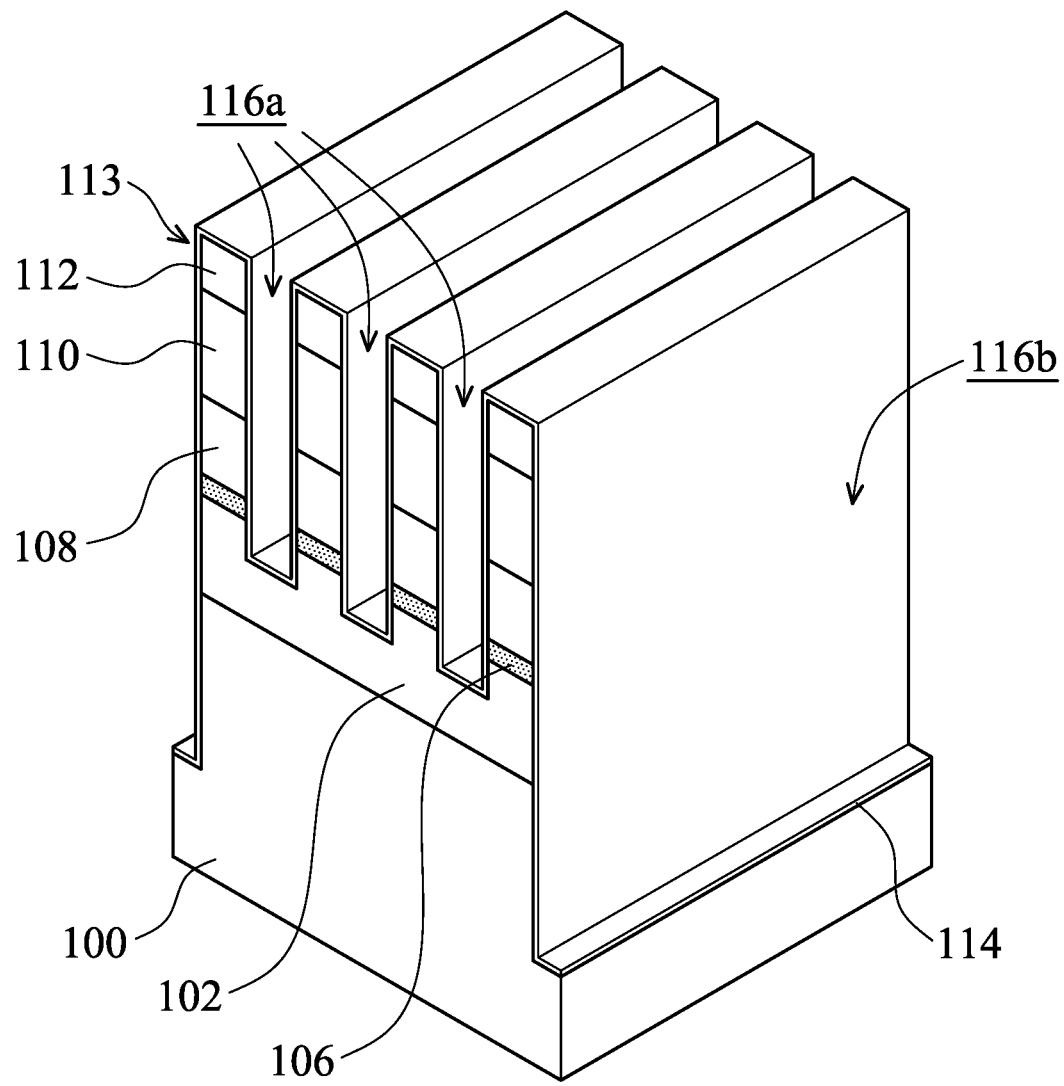
Figure 1D:
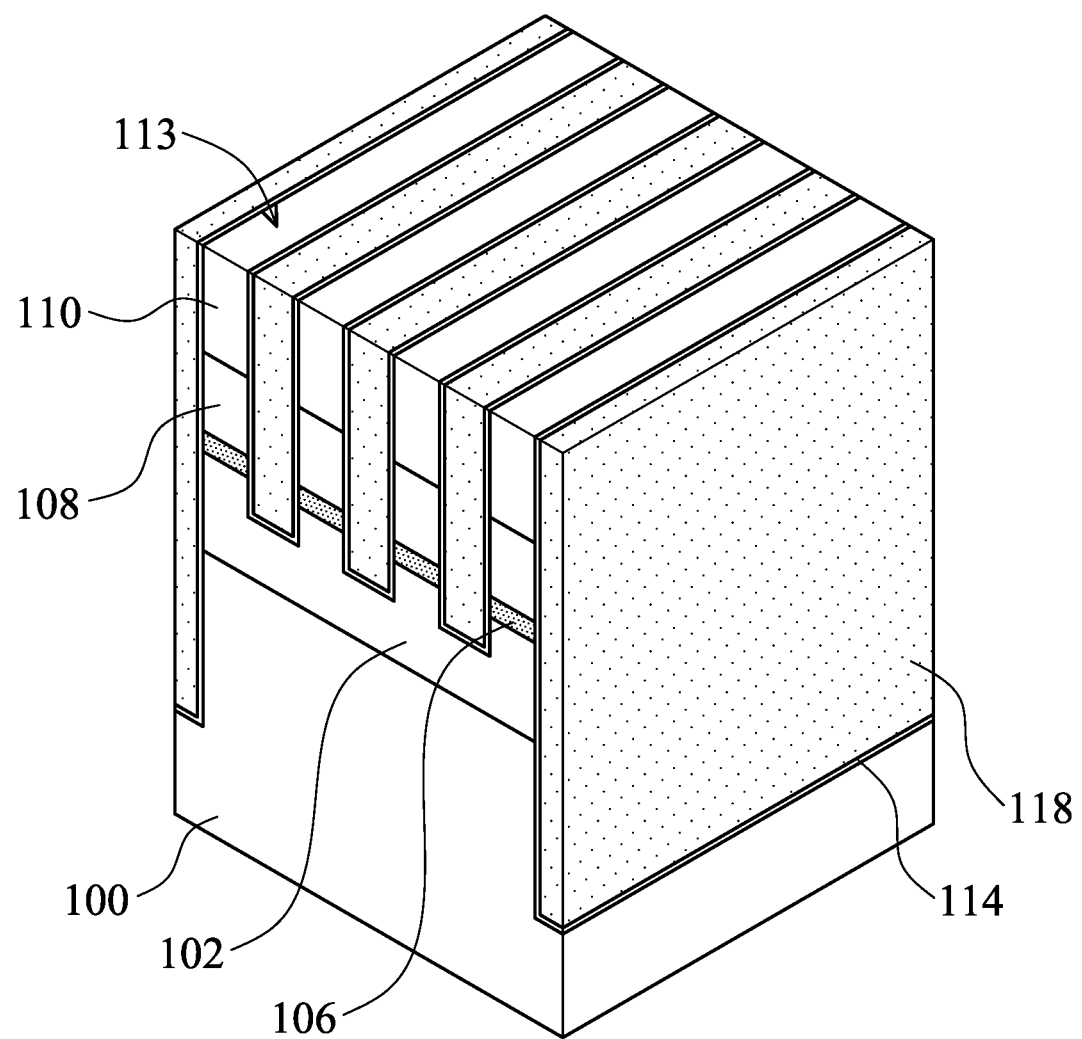
Figure 1E:
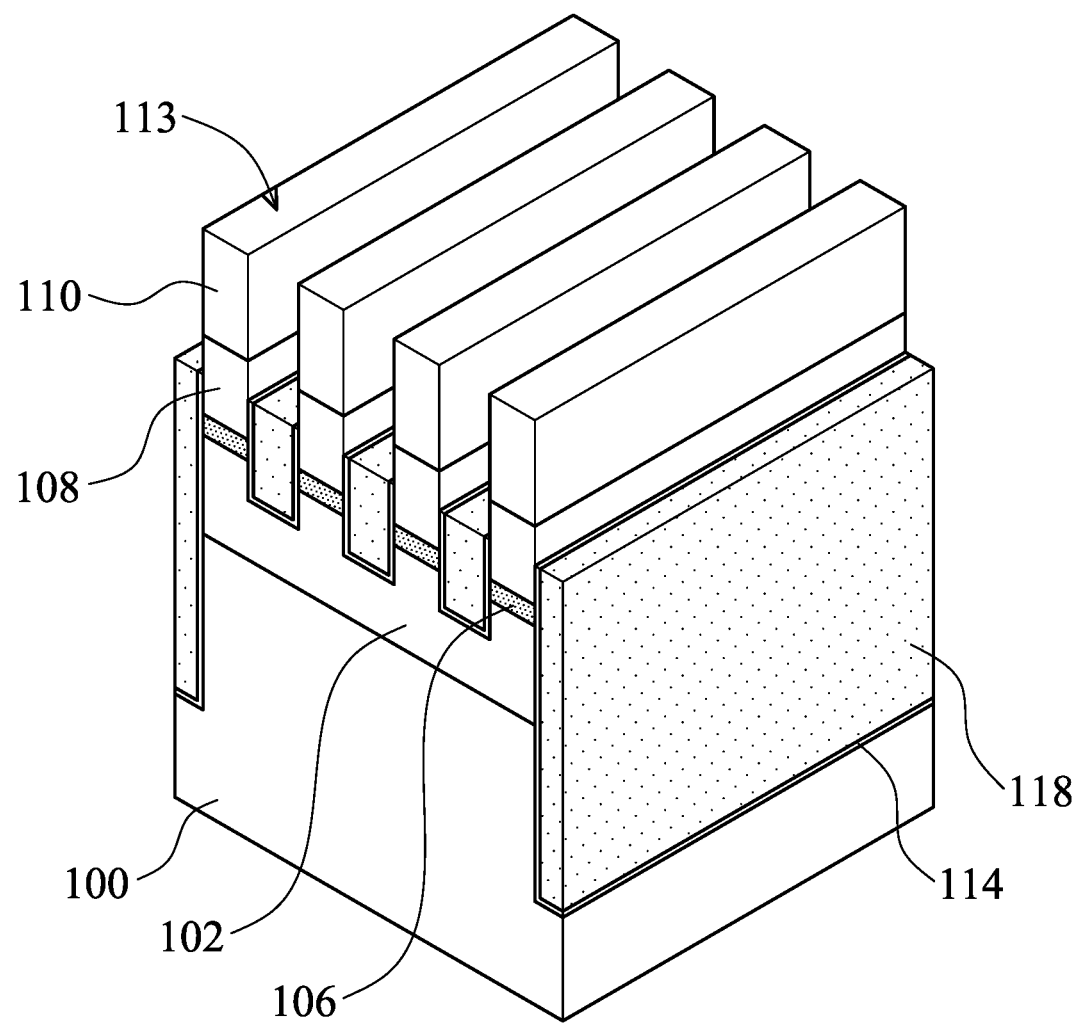
Figure 1F:
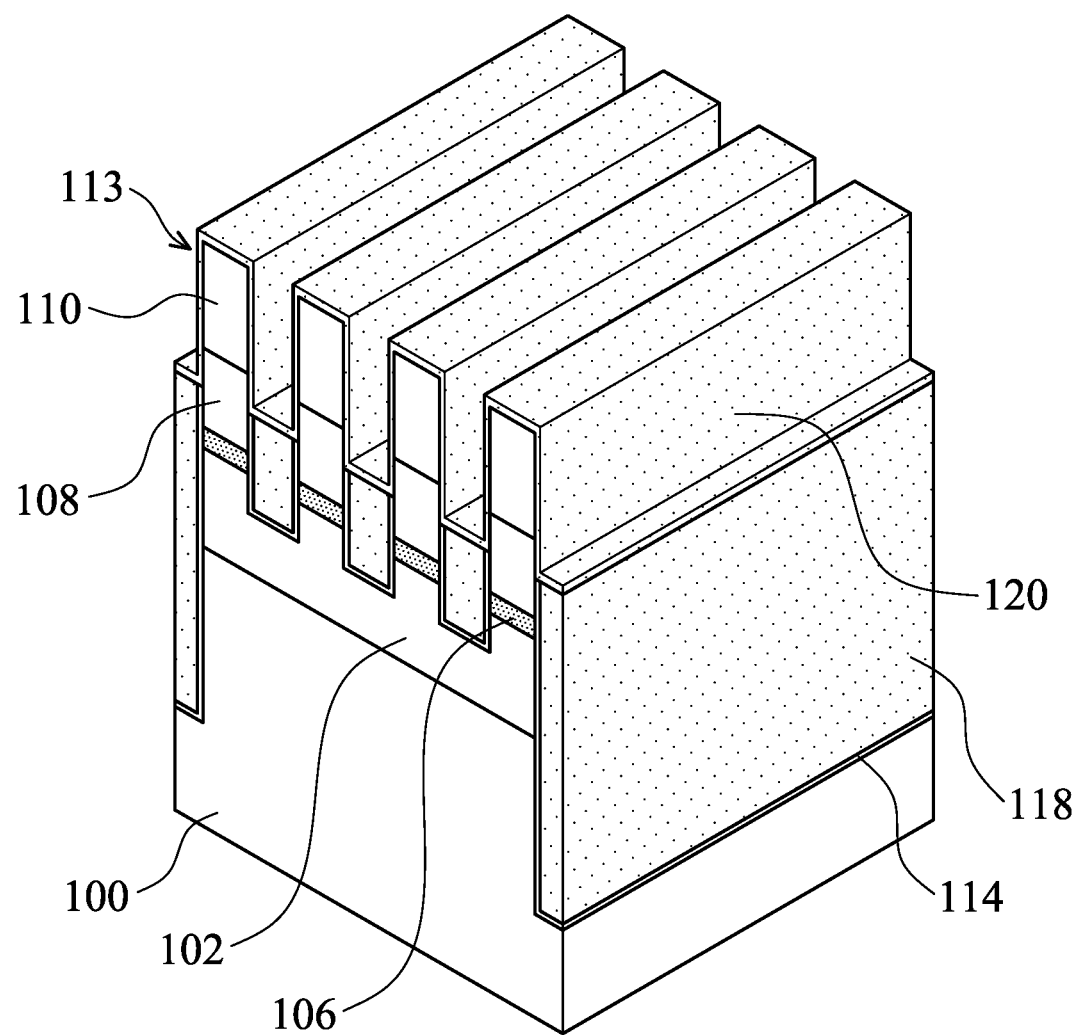
Figure 1G:
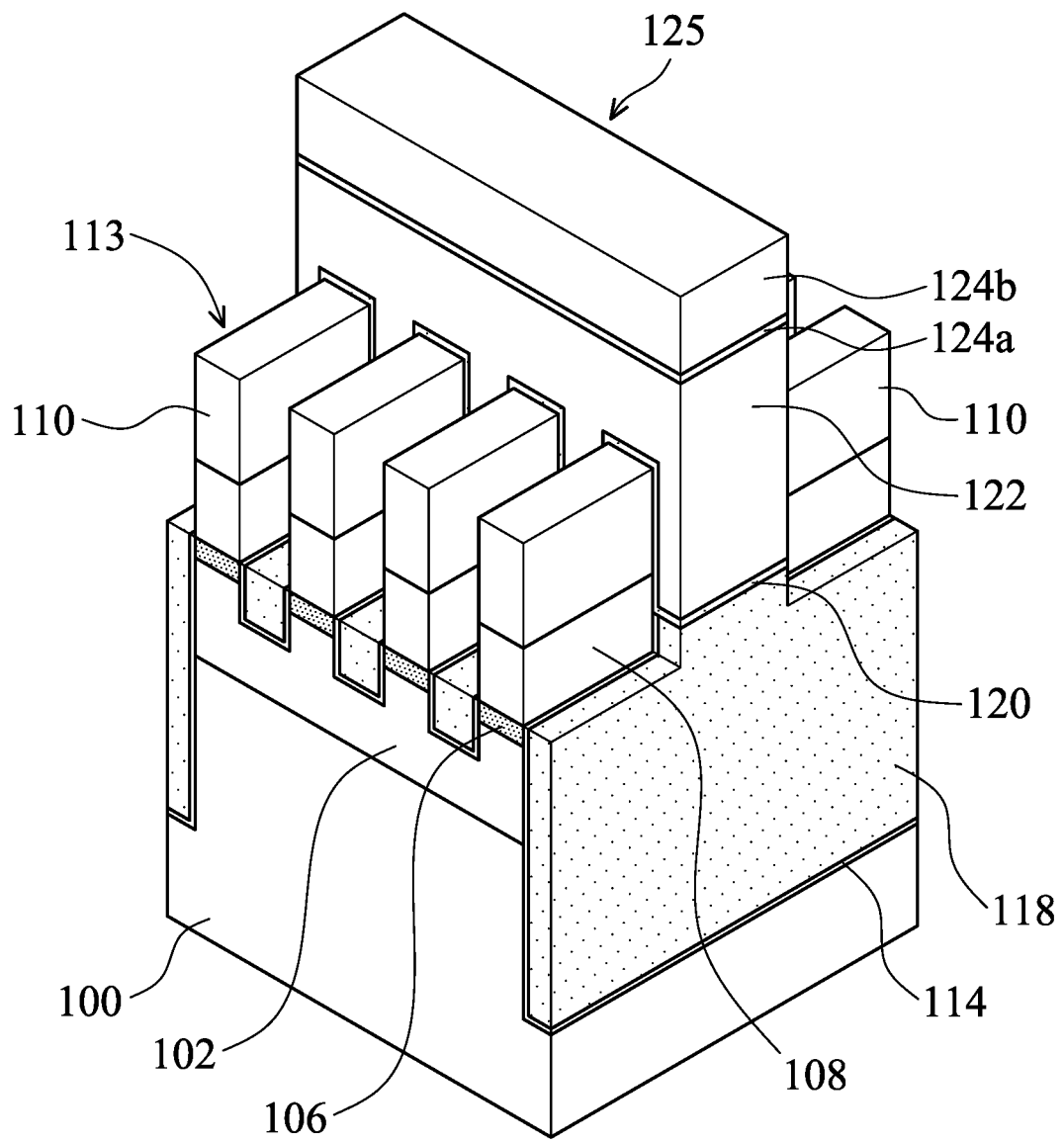
Figures 1, 1G:
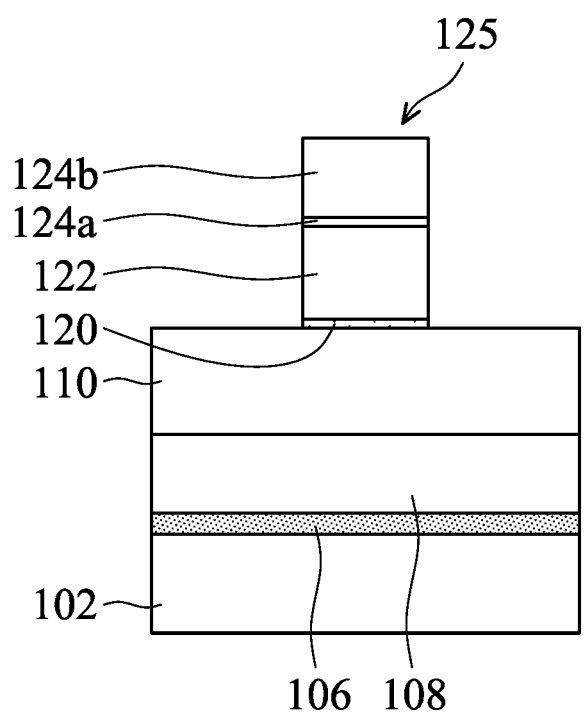
Figure 1H:
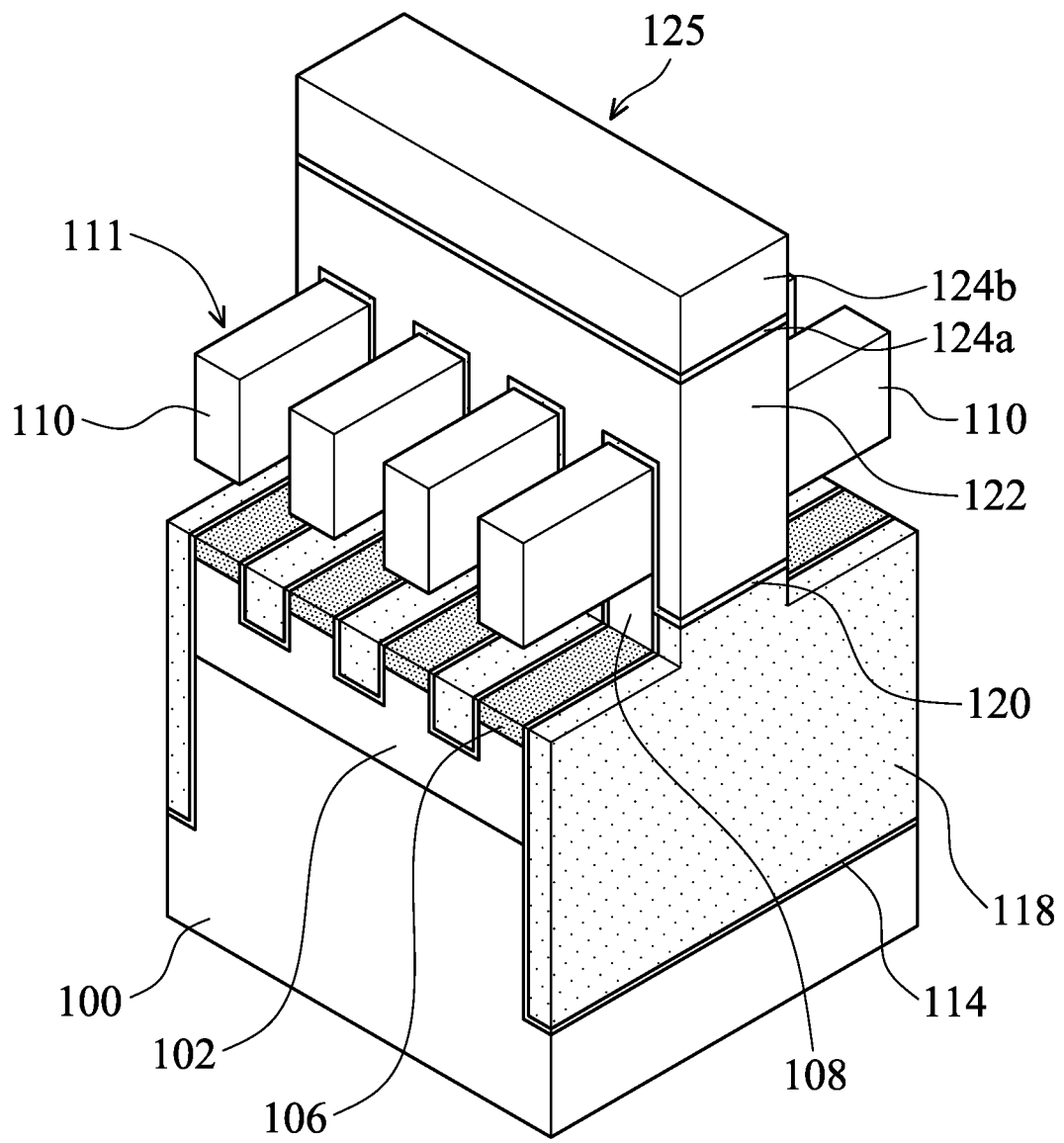
Figures 1, 1H:
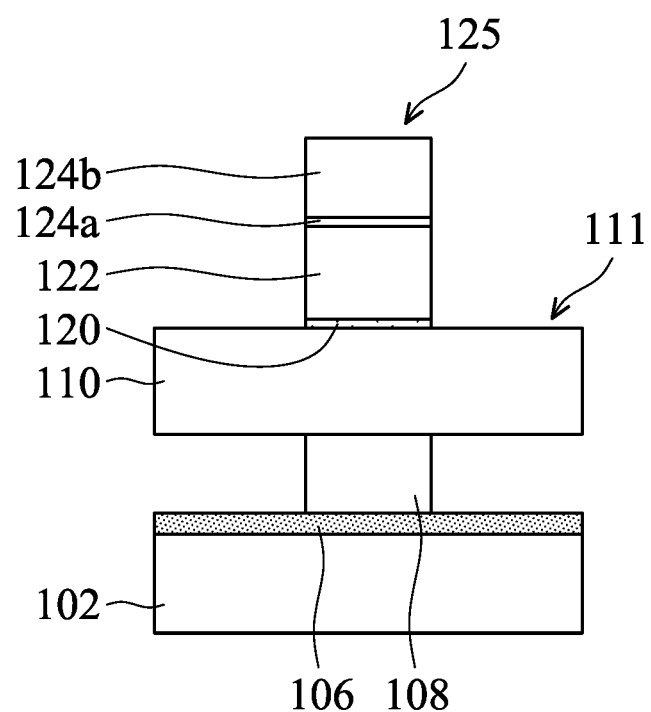
Figure 1I:
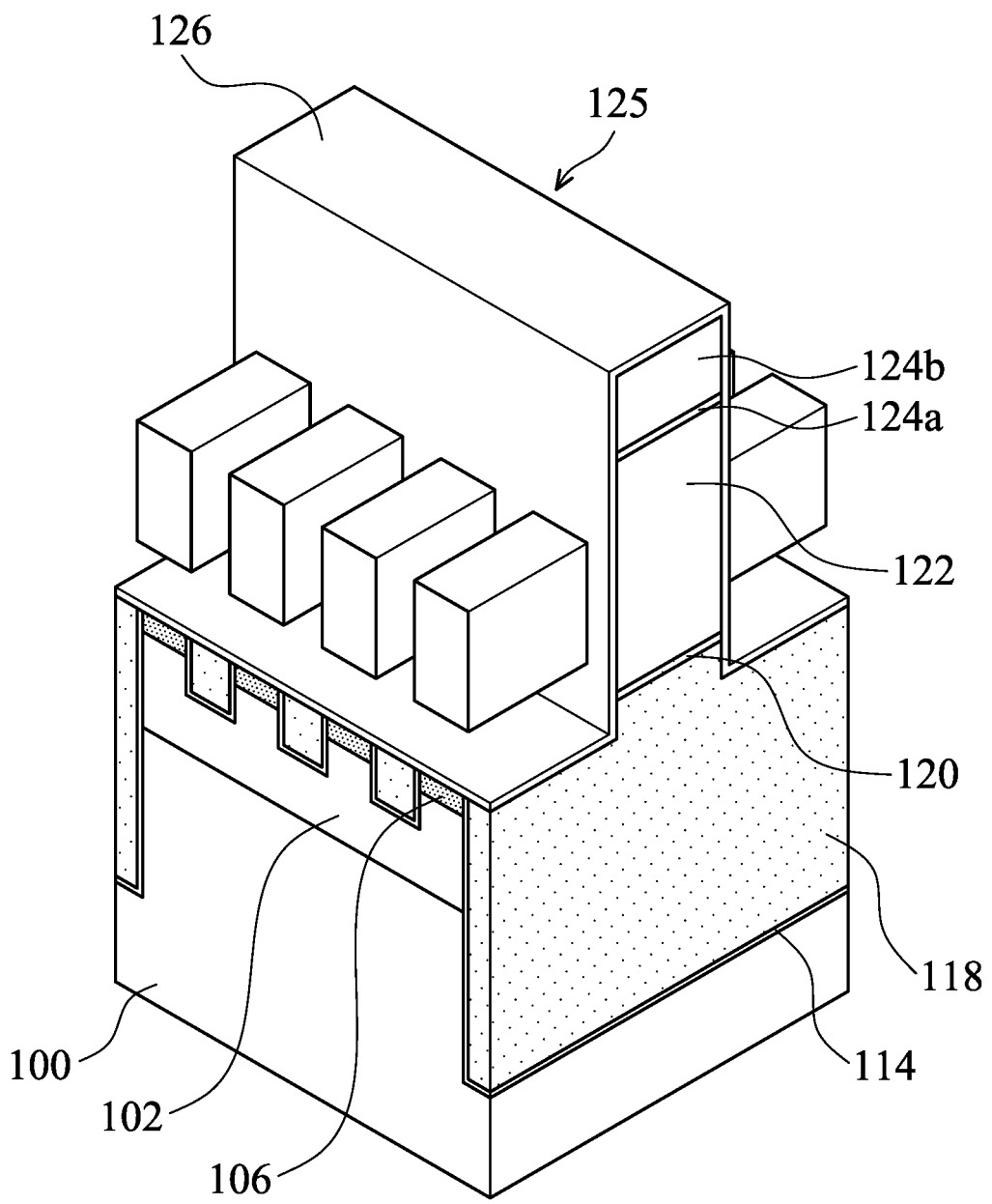
Figures 1, 1I:
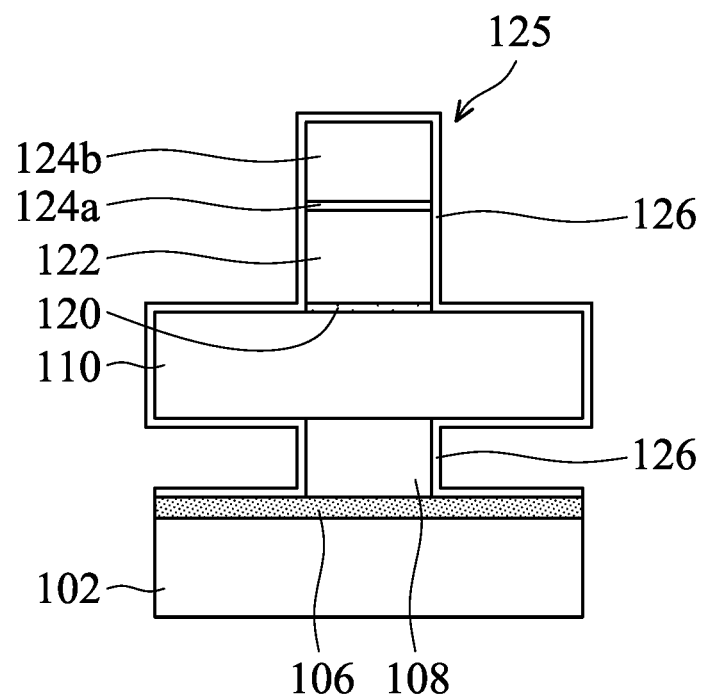
Figure 1J:
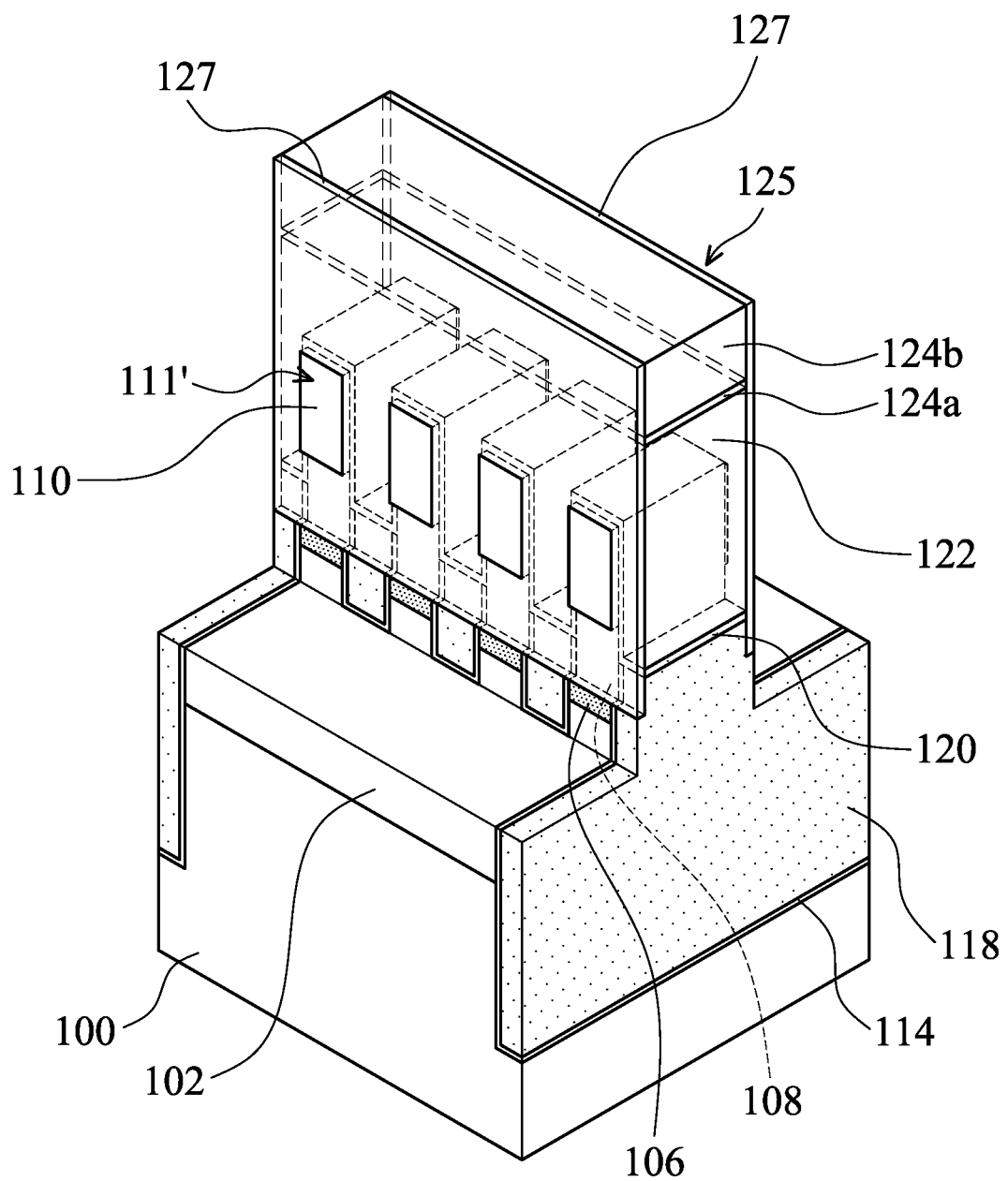
Figures 1, 1J:
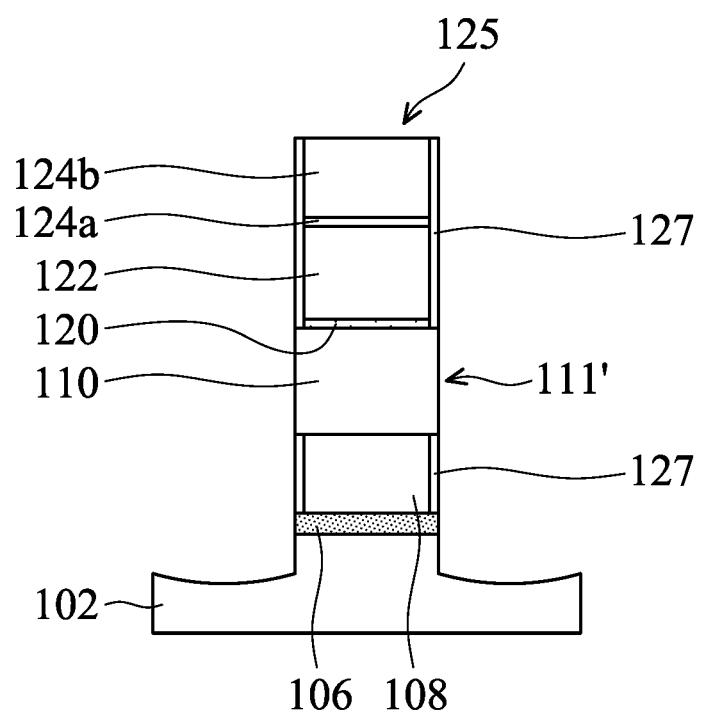
Figure 1K:
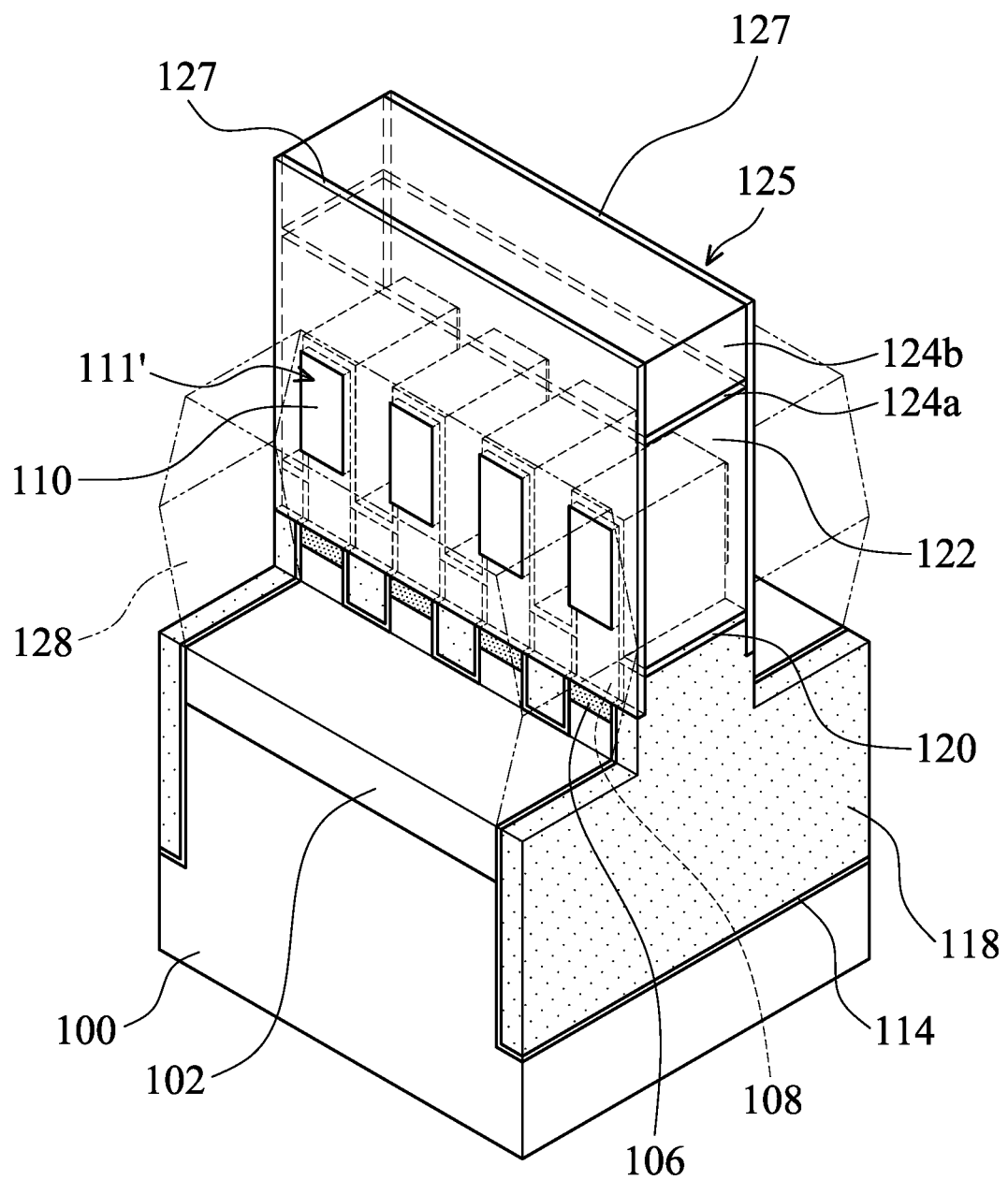
Figures 1, 1K:
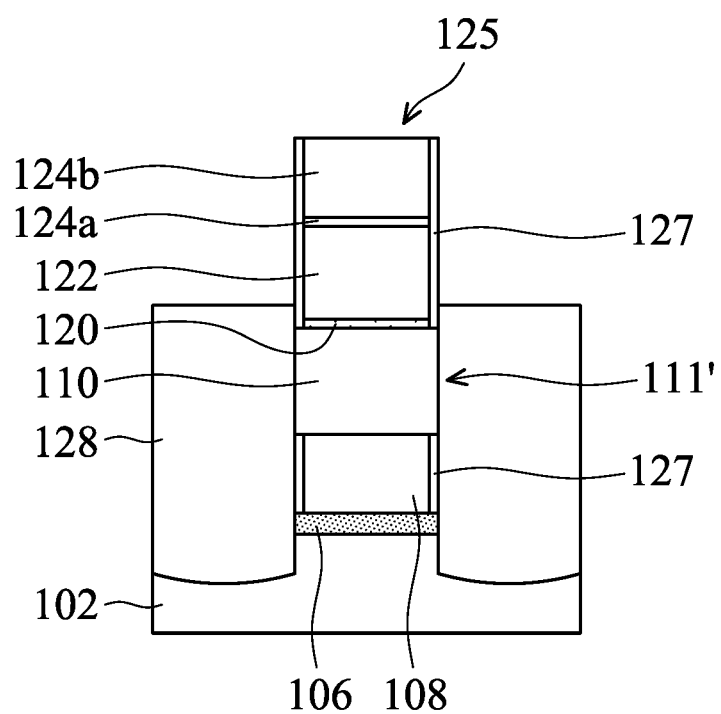
Figure 1L:
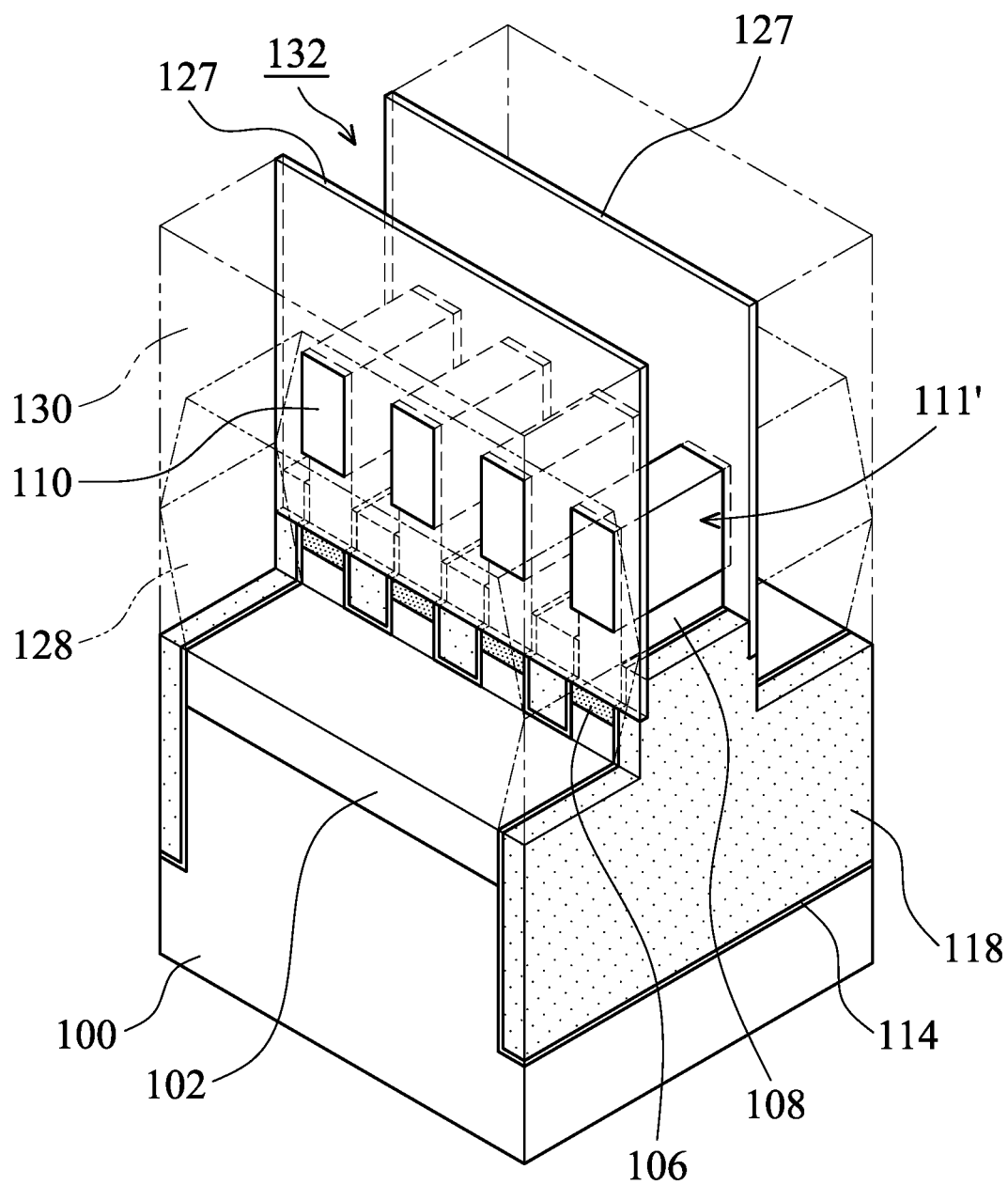
Figures 1, 1L:
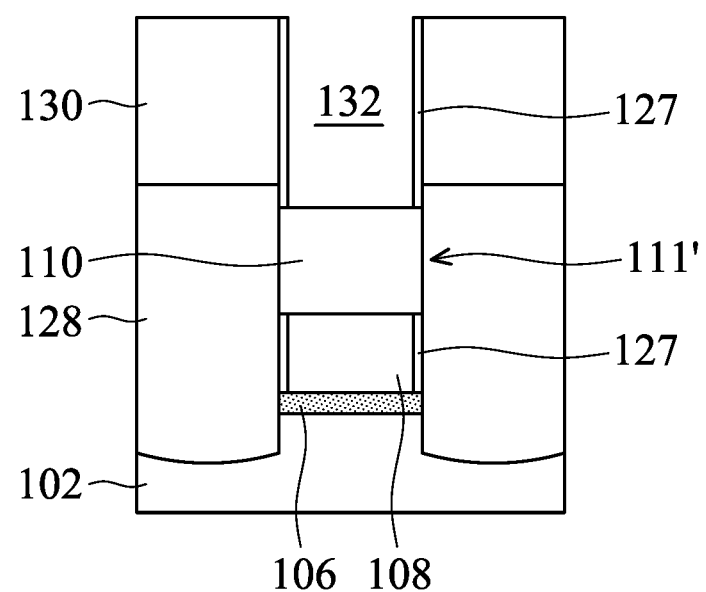
Figure 1M:
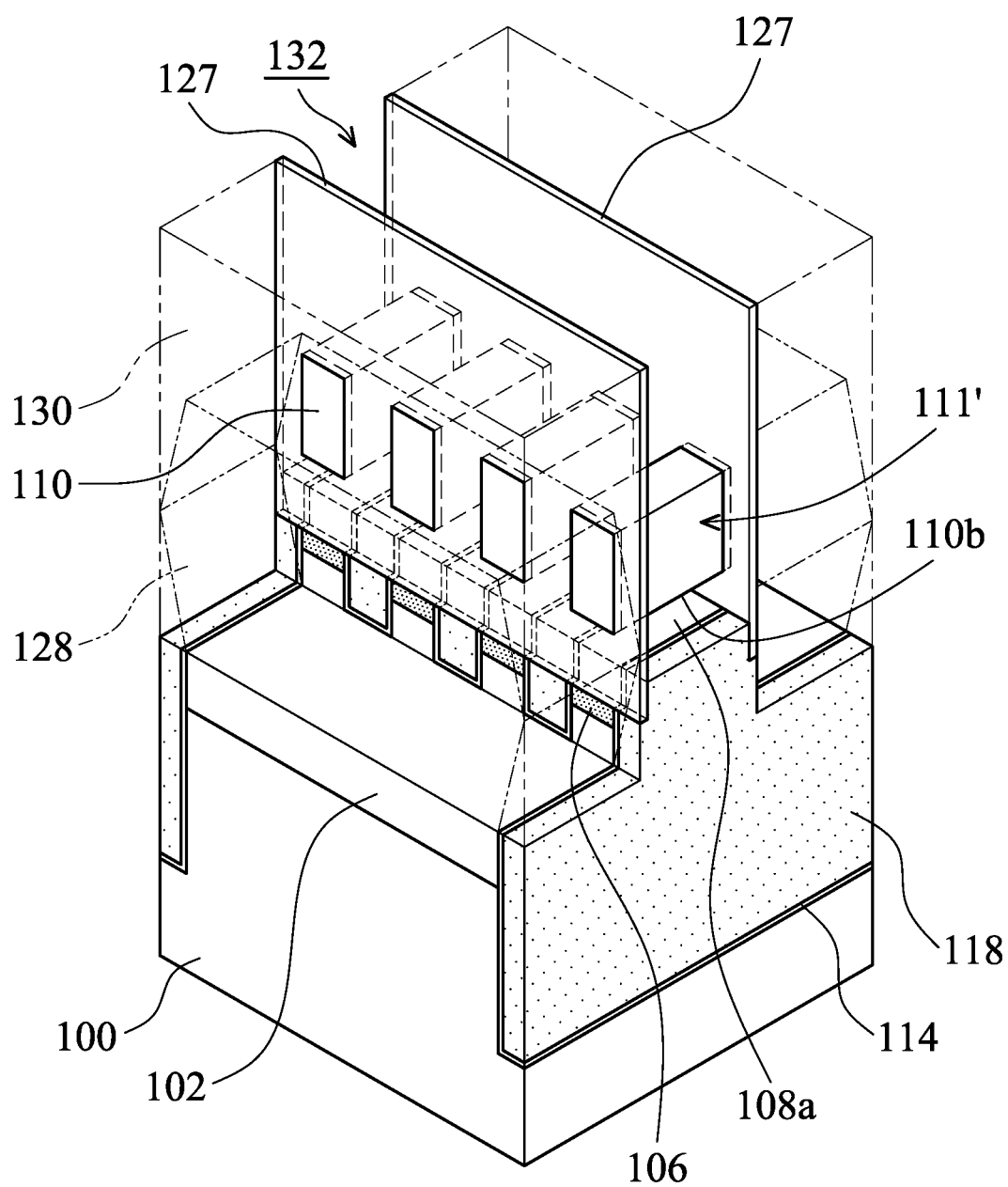
Figures 1, 1M:
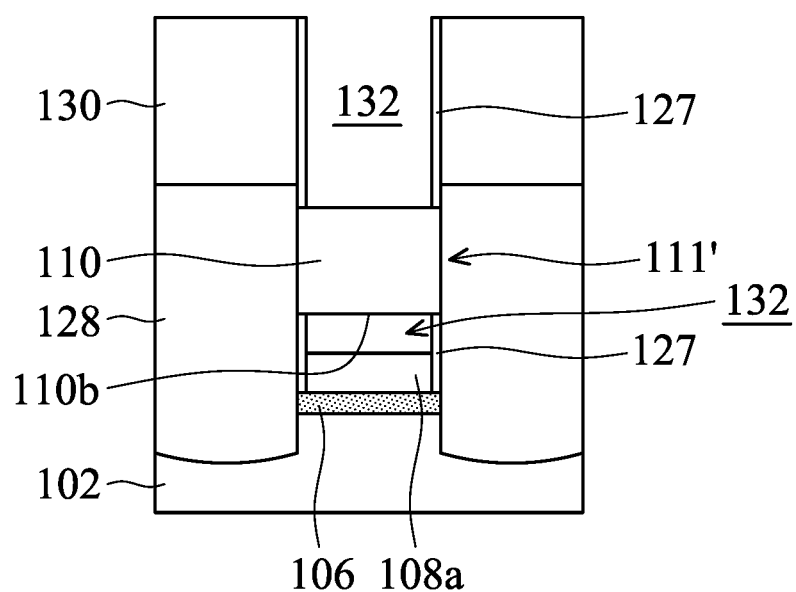
Figure 1N:
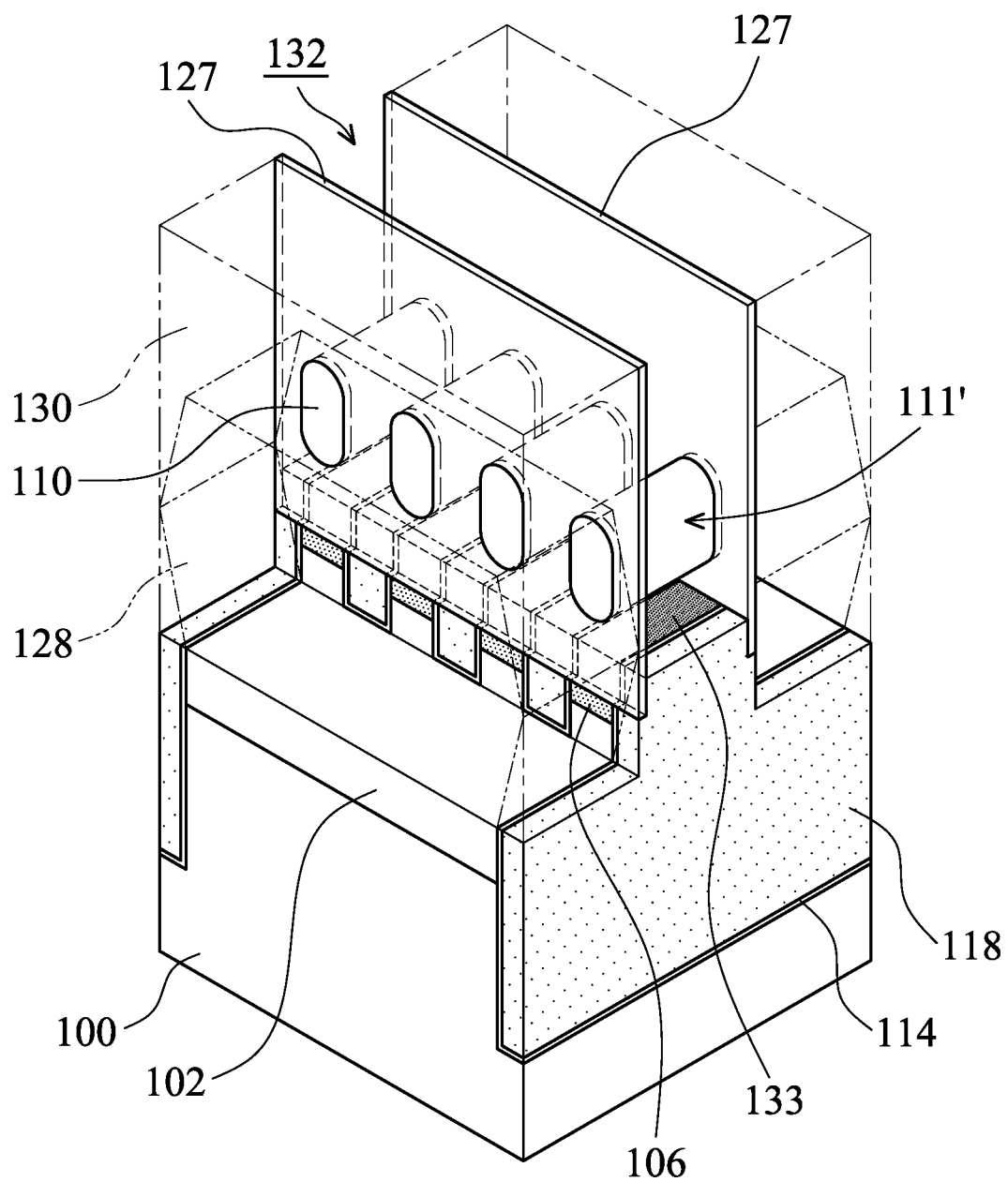
Figures 1, 1N:
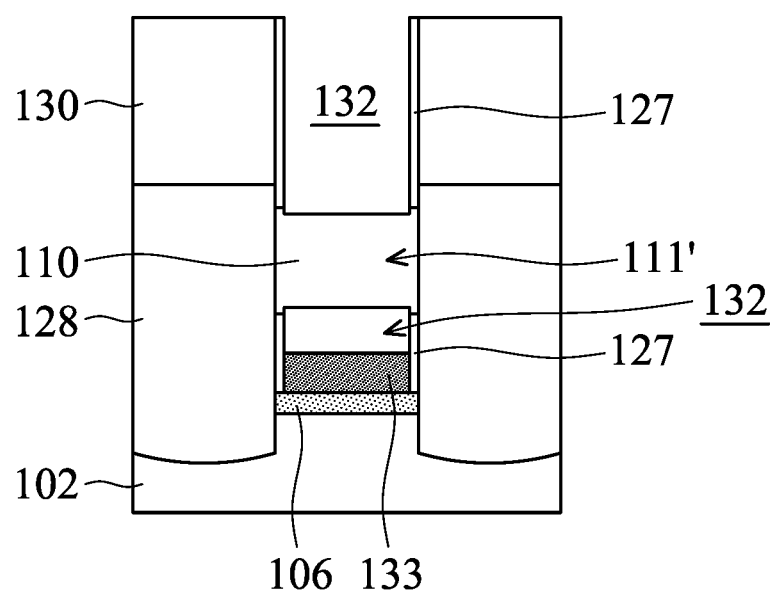
Figure 1O:
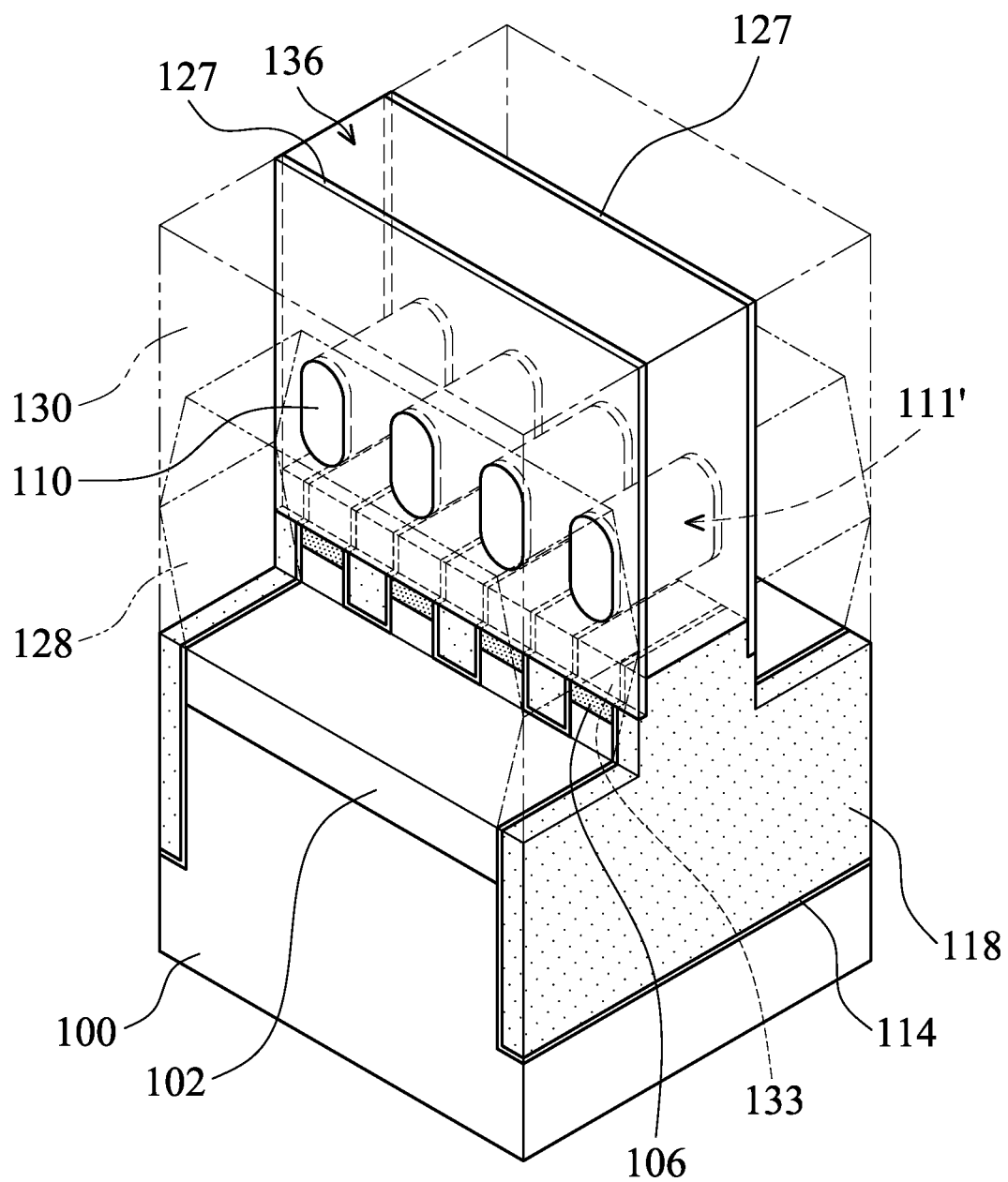

FIGS. 1A-1O are perspective views of various stages of a process for forming a semiconductor device structure, in accordance with some embodiments. FIGS. 1G-1 to 1N-1 are cross-sectional views of various stages of a process for forming a semiconductor device structure, in accordance with some embodiments. In some embodiments, FIGS. 1G-1 to 1N-1 are cross-sectional views of portions of the structure shown in FIGS. 1G to 1N, respectively. FIGS. 1G-1 to 1N-1 may be taken along an imaginary line that penetrates through a gate stack and one fin structure.

As shown in FIG. 1A, a semiconductor substrate 100 is received or provided. In some embodiments, the semiconductor substrate 100 is a bulk semiconductor substrate, such as a semiconductor wafer. For example, the semiconductor substrate 100 includes silicon or other elementary semiconductor materials such as germanium. The semiconductor substrate 100 may be un-doped or doped (e.g., p-type, n-type, or a combination thereof). In some embodiments, the semiconductor substrate 100 includes an epitaxially grown semiconductor layer on a dielectric layer. The epitaxially grown semiconductor layer may be made of silicon germanium, silicon, germanium, one or more other suitable materials, or a combination thereof.

In some other embodiments, the semiconductor substrate 100 includes a compound semiconductor. For example, the compound semiconductor includes one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions. Each of them is greater than or equal to zero, and added together they equal 1. The compound semiconductor may include silicon carbide, gallium arsenide, indium arsenide, indium phosphide, one or more other suitable compound semiconductors, or a combination thereof. Other suitable substrate including II-VI compound semiconductors may also be used.

In some embodiments, the semiconductor substrate 100 is an active layer of a semiconductor-on-insulator (SOI) substrate. The SOI substrate may be fabricated using a separation by implantation of oxygen (SIMOX) process, a wafer bonding process, another applicable method, or a combination thereof. In some other embodiments, the semiconductor substrate 100 includes a multi-layered structure. For example, the semiconductor substrate 100 includes a silicon-germanium layer formed on a bulk silicon layer.

As shown in FIG. 1A, a doped region 102 is formed in an upper portion of the semiconductor substrate 100, in accordance with some embodiments. In some embodiments, the doped region 102 is an anti-punch-through (APT) region. The APT region may be used to offer greater protection against punch-through. As a result, current leakage caused by punch-through may be reduced or prevented.

In some embodiments, an ion implantation process 104 is performed to dope the upper portion of the semiconductor substrate 100 with suitable dopants for forming the doped region 102, as shown in FIG. 1A. In some embodiments, since the ion implantation process for forming the APT region is performed before the formation of fin structures or fin channel structures, the fin structures or fin channel structures are prevented from being damaged or negatively affected by the ion implantation process. Device quality and reliability are therefore improved.

In some embodiments, the concentration of dopants in the doped region 102 is in a range from about 1E18 atoms/cm³ to about 1E19 atoms/cm³. In some other embodiments, the concentration of the dopants in the doped region 102 is in a range from about 5E18 atoms/cm³ to about 1E20 atoms/cm³. Because the doped region 102 is formed before the formation of the fin structures or fin channel structures, the concentration of dopants in the doped region 102 may be increased depending on requirements. Even if the concentration of dopants is increased, the fin structures or fin channel structures are still prevented from being damaged or negatively affected since the ion implantation process is performed before the fin structures or fin channel structures are formed.

In some embodiments, the doped region 102 is a p-type doped region. The doped region 102 may be a portion of the semiconductor substrate 100 doped with one or more p-type dopants. The p-type dopant(s) include(s), for example, boron. In some of these cases, one or more NMOS FinFET devices will be formed over the doped region 102.

In some other embodiments, the doped region 102 is an n-type doped region. The doped region 102 may be a portion of the semiconductor substrate 100 doped with one or more n-type dopants. The n-type dopant(s) include(s), for example, phosphor or arsenic. In some of these cases, one or more PMOS FinFET devices will be formed over the doped region 102.

Referring to FIG. 1B, a blocking layer 106 is deposited over the doped region 102, in accordance with some embodiments. The blocking layer is configured to block or prevent dopants in the doped region 102 from entering material layers or elements which will be formed over the blocking layer 106. In some embodiments, the blocking layer 106 is made of or includes silicon carbide, silicon germanium carbide, silicon, one or more other suitable materials, or a combination thereof. In some embodiments, the blocking layer 106 substantially contains no nitrogen. In some embodiments, the blocking layer 106 substantially contains no oxygen.

Many deposition methods may be used to form the blocking layer 106. The deposition methods may include a chemical vapor deposition (CVD) process, an atomic layer deposition (ALD) process, a physical vapor deposition (PVD) process, a spin coating process, an epitaxial growth process, one or more other applicable processes, or a combination thereof.

As shown in FIG. 1B, a first semiconductor layer 108, a second semiconductor layer 110, and a hard mask layer 112 are deposited over the blocking layer 106, in accordance with some embodiments. In some embodiments, the semiconductor layers 108 and 110 are made of different materials. In some embodiments, the semiconductor layer 108 is made of a semiconductor material that is more easily oxidized than that of the semiconductor layer 110 under the same atmosphere for oxidation. In some embodiments, the semiconductor layer 108 is made of or includes silicon germanium, and the semiconductor layer 110 is made of or includes silicon.

In some embodiments, the semiconductor layers 108 and 110 are formed using an epitaxial growth operation. Each of the semiconductor layers 108 and 110 may be formed using a selective epitaxial growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, one or more other applicable processes, or a combination thereof. In some embodiments, the semiconductor layers 108 and 110 are grown in-situ in the same process chamber.

The hard mask layer 112 may be used to assist in the subsequent patterning of the semiconductor layers 108 and 110. In some embodiments, the hard mask layer 112 includes multiple sub-layers. The hard mask layer 112 may include a dielectric material, a metal material, one or more other suitable materials, or a combination thereof. In some embodiments, the hard mask layer 112 is made of silicon nitride, silicon oxide, silicon carbide, silicon oxynitride, titanium nitride, titanium, one or more other suitable materials, or a combination thereof.

In some embodiments, the hard mask layer 112 is deposited using a CVD process, a PVD process, a spin coating process, an electroplating process, one or more other applicable processes, or a combination thereof. Many variations or modifications may be made to embodiments of the disclosure. In some other embodiments, the hard mask layer 112 is not formed.

Referring to FIG. 1C, multiple recesses 116a and 116b are formed to pattern the semiconductor layers 110 and 108 and the semiconductor substrate 100 into multiple fin structures 113, in accordance with some embodiments. In some embodiments, multiple photolithography processes and etching processes are performed to form the recesses 116a and 116b. For example, a patterned photoresist layer is formed over the hard mask layer 112. Afterwards, using the patterned photoresist layer as an etching mask, the hard mask layer 112 is partially removed to have the desired patterns. Afterwards, the hard mask layer 112 with the desired patterns is used as an etching mask for patterning the semiconductor layers 110 and 108 and the semiconductor substrate 100.

In some embodiments, the recess 116b is deeper than the recess 116a. The recess 116b may be used to separate two neighboring FinFET devices. The recesses 116a and 116b may be formed in different etching processes.

Many variations and/or modifications can be made to embodiments of the disclosure. In some other embodiments, the recesses 116b are not formed.

As shown in FIG. 1C, a liner layer 114 is deposited over sidewalls and bottom portions of the recesses 116a and 116b, in accordance with some embodiments. In some embodiments, the liner layer 114 is conformally deposited. The liner layer 114 may be used to reduce crystalline defects at the interface between the fin structures 113 and an isolation feature which will be subsequently formed in the recesses 116a and 116b.

In some embodiments, the liner layer 114 is made of or includes silicon oxide, silicon nitride, silicon oxynitride, one or more other suitable materials, or a combination thereof. The liner layer 114 may be deposited using a CVD process, an ALD process, a spin coating process, one or more other applicable processes, or a combination thereof.

In some embodiments, the liner layer 114 is doped. In some embodiments, the liner layer 114 is doped with a p-type dopant such as boron. In some embodiments, the liner layer 114 that is doped with the p-type dopant is used for surrounding fin structures of an NMOS device. In some embodiments, the liner layer 114 is doped with an n-type dopant such as phosphor. In some embodiments, the liner layer 114 that is doped with the n-type dopant is used for surrounding fin structures of a PMOS device. In some embodiments, one or more ion implantation processes are used to dope the liner layer 114.

Many variations and/or modifications can be made to embodiments of the disclosure. In some other embodiments, the liner layer 114 is not formed.

Referring to FIG. 1D, an isolation feature 118 is formed in the recesses 116a and 116b, in accordance with some embodiments. The isolation feature 118 is used to define and electrically isolate various device elements formed in and/or over the semiconductor substrate 100. In some embodiments, the isolation feature 118 includes shallow trench isolation (STI) features, local oxidation of silicon (LOCOS) features, another suitable isolation feature, or a combination thereof.

In some embodiments, the isolation feature 118 is made of a dielectric material. The dielectric material may include silicon oxide, silicon nitride, silicon oxynitride, fluoride-doped silicate glass (FSG), low-K dielectric material, other suitable materials, or a combination thereof.

In some embodiments, a dielectric material layer is deposited over the semiconductor substrate 100. The dielectric material layer covers the fin structures 113 and fills the recesses 116a and 116b. In some embodiments, the dielectric material layer is deposited using a CVD process, an ALD process, a spin coating process, one or more other applicable processes, or a combination thereof. In some embodiments, the dielectric material layer is deposited using a flowable chemical vapor deposition (FCVD) process.

In some embodiments, a planarization process is performed afterwards to thin the dielectric material layer until the fin structures 113 or the hard mask over the fin structures 113 are exposed. As a result, the isolation feature 118 is formed. In some embodiments, the hard mask layer 112 and portions of the liner layer 114 are also removed by the planarization process. The planarization process may include a chemical mechanical polishing (CMP) process, a grinding process, an etching process, a dry polishing process, one or more other applicable processes, or a combination thereof. As shown in FIG. 1D, the fin structures 113 are surrounded by the isolation feature 118 at this stage.

As shown in FIG. 1E, upper portions of the isolation feature 118 and the liner layer 114, which originally surround the fin structures 113, are removed, in accordance with some embodiments. As a result, the fin structures 113 protrude from the top surface of the isolation feature 118, as shown in FIG. 1E.

In some embodiments, one or more etching operations are used to recess the isolation feature 118 and the liner layer 114. In some embodiments, the semiconductor layer 110 is not surrounded or covered by the isolation feature 118 after the recessing of the isolation feature 118, as shown in FIG. 1E. In some embodiments, after the recessing of the isolation feature 118, lower portions of the semiconductor layer 108 are still surrounded or covered by the isolation feature 118 while upper portions of the semiconductor layer 108 are not, as shown in FIG. 1E.

As shown FIG. 1F, a dummy layer 120 is deposited over top portions and sidewalls of the fin structures 113, in accordance with some embodiments. The dummy layer 120 may serve as an etch stop layer during subsequent etching processes. The dummy layer 120 may also be used as a dummy gate dielectric layer of a dummy gate stack that will be formed later. In some embodiments, the dummy layer 120 is made of a dielectric material. For example, the dummy layer 120 is made of silicon oxide. In some embodiments, the dummy layer 120 is conformally deposited over the fin structures 113. The dummy layer 120 may be deposited using a CVD process, an ALD process, a PVD process, a spin coating process, one or more other applicable processes, or a combination thereof.

As shown in FIG. 1G, a dummy gate stack 125 is formed over the isolation feature 118 and a portion of the fin structures 113, in accordance with some embodiments. The portions of the semiconductor layer 110 surrounded by the dummy gate stack 125 may serve as fin channel structures. In some embodiments, the dummy gate stack 125 includes the dummy layer 120, a dummy gate electrode 122, and hard masks 124a and 124b.

In some embodiments, the dummy gate electrode 122 is made of or includes polysilicon. The hard masks 124a and 124b may be used to assist in the patterning process for forming the dummy gate stack 125. In some embodiments, the hard masks 124a and 124b are made of different materials. The hard masks 124a and 124b may be made of silicon oxide, silicon nitride, silicon oxynitride, silicon carbide, one or more other suitable materials, or a combination thereof.

Many variations and modifications can be made to embodiments of the disclosure. In some other embodiments, the hard masks 124a and 124b are not formed.

In some embodiments, a dummy gate electrode layer and one or more hard mask layers are deposited over the dummy layer 120. In some embodiments, the gate dummy electrode layer and the hard mask layers are sequentially deposited by using suitable deposition methods. The suitable deposition methods may include a CVD process, an ALD process, a PVD process, one or more other applicable processes, or a combination thereof. Afterwards, a photolithography process and an etching process are performed to pattern the hard mask layers so as to form the hard mask s 124a and 124b.

With the assistance of the hard masks 124a and 124b, the gate dummy electrode layer is patterned. As a result, the dummy gate electrode 122 is formed. During the etching process for forming the dummy gate electrode 122, the dummy layer 120 may serve as an etch stop layer to protect the fin structures 113 under the dummy layer 120. Afterwards, the portions of the dummy layer 120 that are not covered by the dummy gate electrode 122 are removed using, for example, another etching process. As a result, the dummy layer 120 is patterned, and the dummy gate stack 125 is formed, as shown in FIGS. 1G and 1G-1. As mentioned above, in some embodiments, FIG. 1G-1 shows the cross-sectional view of a portion of the structure shown in FIG. 1G.

As shown in FIGS. 1H and 1H-1, portions of the semiconductor layer 108 not under the dummy gate stack 125 are removed, in accordance with some embodiments. In some embodiments, one or more etching processes are used to partially remove the semiconductor layer 108. As a result, the blocking layer 106 is partially exposed, as shown in FIGS. 1H and 1H-1.

In some embodiments, the etch selectivity between the semiconductor layer 110 and the semiconductor layer 108 is high. Therefore, the semiconductor layer 110 substantially remains. As shown in FIGS. 1H and 1H-1, fin structures 111 constructed by the semiconductor layer 110 are formed. Each of the fin structures 111 is separated from (or suspended above) the blocking layer 106.

Referring to FIGS. 1I and 1I-1, a spacer layer 126 is deposited over the structure shown in FIGS. 1H and 1H-1, in accordance with some embodiments. In some embodiments, the spacer layer 126 is conformally deposited. In some embodiments, the spacer layer 126 is made of a dielectric material. The dielectric material may include silicon carbon nitride, silicon nitride, silicon oxynitride, one or more other suitable materials, or a combination thereof. The spacer layer 126 may have a thickness that is in a range from about 2 nm to about 10 nm. In some embodiments, the spacer layer 126 is deposited using a CVD process, an ALD process, a spin coating process, one or more other applicable processes, or a combination thereof.

As shown in FIGS. 1J and 1J-1, the spacer layer 126, the fin structures 111, and the blocking layer 106 originally shown in FIGS. 1I and 1I-1 are partially removed, in accordance with some embodiments. As a result, the doped region 102 is exposed. Multiple etching processes may be used to partially remove the spacer layer 126, the fin structures 111, and the blocking layer 106. The remaining portions of the spacer layer 126 form spacer elements 127 over sides of the dummy gate stack 125, as shown in FIGS. 1J and 1J-1. Some elements covered by the spacer elements 127 are illustrated as dashed lines in FIG. 1J.

In some embodiments, the doped region 102 in the semiconductor substrate 100 is also partially removed, as shown in FIGS. 1J and 1J-1. After the etching processes, space is created for a subsequent formation process of source/drain structures.

The remaining portions of the fin structures 111 surrounded by the dummy gate stack 125 form multiple semiconductor strips 111', as shown in FIGS. 1J and 1J-1. The semiconductor strips 111' may serve as fin channel structures. After subsequent formation processes, the semiconductor strips 111' are used as channel regions of the FinFET device, in accordance with some embodiments.

Referring to FIGS. 1K and 1K-1, source/drain structures 128 are respectively formed over the doped regions 102, in accordance with some embodiments. For illustration purpose, the source/drain structures 128 are illustrated as dashed lines so that the elements covered by the source/drain structures 128 are still shown in FIG. 1K. The source/drain structures 128 adjacent to the semiconductor strips 111' may provide stress or strain to the semiconductor strips 111' under the dummy gate stack 125. As a result, the carrier mobility of the device and device performance are improved.

In some embodiments, each of the source/drain structures 128 is in direct contact with one or more of fin channel structures, as shown in FIGS. 1K and 1K-1. In some embodiments, the source/drain structures 128 are also in direct contact with the spacer elements 127 and the blocking layer 106. In some embodiments, the source/drain structures 128 are in direct contact with the doped regions 102 in the semiconductor substrate 100. The doped regions 102 may serve as an anti-punch-through region to prevent current leakage between neighboring source/drain structures 128.

In some other embodiments, the source/drain structures 128 are p-type regions. For example, the source/drain structures 128 may include epitaxially grown silicon germanium or silicon germanium doped with boron. In some of these cases, the doped region 102 is an n-type region. It should be appreciated, however, that the source/drain structures 128 are not limited to being p-type regions. In some embodiments, the source/drain structures 128 are n-type regions. The source/drain structures 128 may include epitaxially grown silicon, epitaxially grown silicon carbide (SiC), epitaxially grown silicon phosphide (SiP), or another suitable epitaxially grown semiconductor material. In some of these cases, the doped region 102 is a p-type region.

In some embodiments, the source/drain structures 128 are formed by using a selective epitaxial growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, one or more other applicable processes, or a combination thereof.

In some embodiments, the source/drain structures 128 are doped with one or more suitable dopants. For example, the source/drain structures 128 are SiGe source/drain features doped with boron (B), indium (In), or another suitable dopant. Alternatively, in some other embodiments, the source/drain structures 128 are Si source/drain features doped with phosphor (P), antimony (Sb), or another suitable dopant.

In some embodiments, the source/drain structures 128 are doped in-situ during their epitaxial growth. In some other embodiments, the source/drain structures 128 are not doped during the growth of the source/drain structures 128. Instead, after the formation of the source/drain structures 128, the source/drain structures 128 are doped in a subsequent process. In some embodiments, the doping is achieved by using an ion implantation process, a plasma immersion ion implantation process, a gas and/or solid source diffusion process, one or more other applicable processes, or a combination thereof. In some embodiments, the source/drain structures 128 are further exposed to one or more annealing processes to activate the dopants. For example, a rapid thermal annealing process is used.

Afterwards, a dielectric layer 130 is deposited over the dummy gate stack 125 and the source/drain structures 128, as shown in FIGS. 1L and 1L-1 in accordance with some embodiments. A planarization process is then performed to remove the upper portion of the dielectric layer 130 and the hard masks 124a and 124b until the dummy gate electrode 122 is exposed. Afterwards, multiple etching processes are used to remove the dummy gate electrode 122 and the dummy layer 120 to form a recess 132, as shown in FIGS. 1L and 1L-1 in accordance with some embodiments. The recess 132 exposes the semiconductor strips 111' and the portion of the semiconductor layer 108 not covered by the spacer elements 127 and the liner layer 114.

As shown in FIGS. 1M and 1M-1, the exposed portion of the semiconductor layer 108 is removed to expose lower surfaces (or bottom surfaces) 110b of the semiconductor layer 110 (semiconductor strips 111'), in accordance with some embodiments. In some embodiments, an etching process is performed to etch the semiconductor layer 108 from its side surface exposed by the recess 132.

After the etching process, semiconductor features 108a may be formed, as shown in FIGS. 1M and 1M-1. The semiconductor features 108a are the remaining portions of the semiconductor layer 108 after the etching process. As shown in FIGS. 1M and 1M-1, the semiconductor strips 111' are separated from the semiconductor features 108a by the recess 132. The recess 132 further extends under the semiconductor strips 111' to allow the lower surfaces 110b to be exposed.

As shown in FIGS. 1N and 1N-1, the semiconductor features 108a are oxidized to form isolation elements 133, in accordance with some embodiments. In some embodiments, the isolation elements 133 are made of silicon germanium oxide or another semiconductor oxide. In some embodiments, each of the isolation elements 133 has a thickness that is in a range from about 2 nm to about 10 nm.

In some embodiments, a heat treatment is performed on the structure shown in FIGS. 1M and 1M-1 in an oxygen-containing atmosphere until the semiconductor features 108a are oxidized to form the isolation elements 133. In some embodiments, the oxygen-containing atmosphere is a water-containing atmosphere, a hydrogen peroxide-containing atmosphere, an ozone-containing atmosphere, one or more other suitable atmosphere, or a combination thereof. The heat treatment may be performed at a temperature that is in a range from about 300 degrees C. to about 500 degrees C.

As mentioned above, in some embodiments, the semiconductor layer 108 (which forms the semiconductor features 108a) is made of a semiconductor material that is more easily oxidized than that of the semiconductor layer 110 (which forms the semiconductor strips 111') under the same atmosphere for oxidation. Therefore, by fine-tuning the atmosphere for oxidation, the semiconductor strips 111' are substantially not oxidized or only slightly oxidized even if the semiconductor features 108a are oxidized.

In some cases, surface portions of the semiconductor strips 111' are also oxidized. A cleaning operation may be performed to remove the oxidized portions of the semiconductor strips 111'. For example, a cleaning solution is applied on the semiconductor strips 111' to remove the oxidized portions. After the removal of the oxidized portions, the semiconductor strips 111' are shaped to have curved surfaces or relatively rounded profiles, as shown in FIGS. 1N and 1N-1 in accordance with some embodiments. The quality and reliability of the semiconductor strips 111' may be improved.

As shown in FIG. 1O, a gate stack 136 is formed in the recess 132, in accordance with some embodiments. In some embodiments, the gate stack 136 encircles the semiconductor strips 111', which allow the gate stack 136 to control the semiconductor strips 111' from multiple sides (four or more sides) of the semiconductor strips 111'. In some embodiments, the gate stack 136 is a metal gate stack. The gate stack 136 may include a gate dielectric layer that is made of a high-k dielectric material. The gate stack 136 may also include one or more work function layers and one or more metal filling layers. Multiple deposition processes and a planarization process may be used to form the gate stack 136. The materials and formation methods of the gate stack 136 will be illustrated in more details later.

FIGS. 2A-2H are cross-sectional views of various stages of a process for forming a semiconductor device structure, in accordance with some embodiments. In some embodiments, the gate stack 136 shown in FIG. 1O is formed using the process illustrated in FIGS. 2A-2H.

Figure 2A:
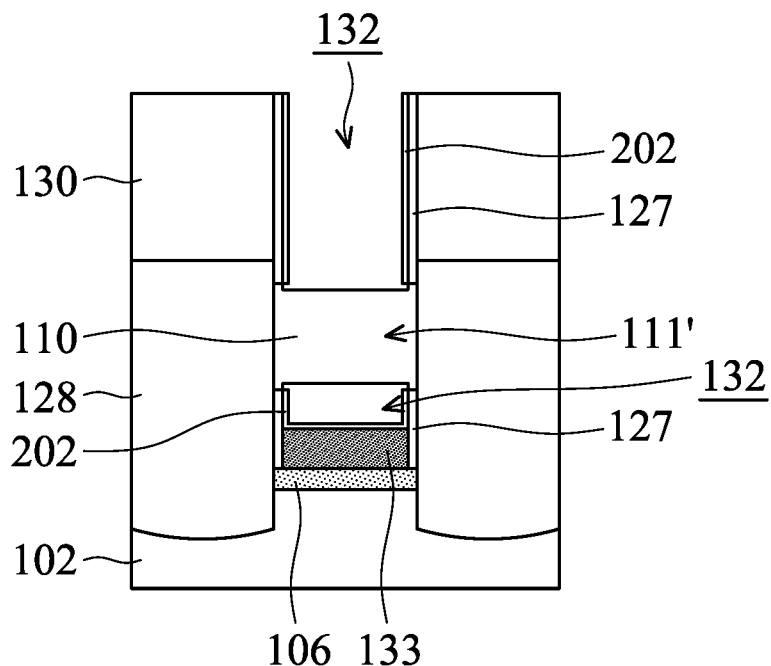
FIGS. 2A-2H are cross-sectional views of various stages of a process for forming a semiconductor device structure, in accordance with some embodiments.

As shown in FIG. 2A, a cleaning operation is used to remove native oxide grown on the surface of the semiconductor strip 111', in accordance with some embodiments. For example, a dilute hydrofluoric acid (DHF) is used for removing the native oxide. In some other embodiments, the cleaning operation illustrated in FIGS. 1N and 1N-1 also removes the native oxide grown on the surface of the semiconductor strip 111'. In these cases, the cleaning operation illustrated in FIG. 2A may not be performed. However, in some other embodiments, the cleaning operation illustrated in FIG. 2A is performed to ensure a clean removal of the native oxide grown on the semiconductor strip 111'.

Afterwards, an initiator layer 202 is formed on the interior surfaces of the spacer elements 127, as shown in FIG. 2A in accordance with some embodiments. In some embodiments, the initiator layer 202 is made of a material capable of selectively bonding to a dielectric material, such as a low-k material. Therefore, the initiator layer 202 is selectively formed on the interior surfaces of the spacer elements 127. The initiator layer 202 selectively bonds to the interior surfaces of the spacer elements 127. In some embodiments, the initiator layer 202 is not formed directly on the semiconductor strip 111'. The initiator layer 202 does not bond to a semiconductor material such as the semiconductor strip 111'. In some embodiments, the initiator layer 202 is not in direct contact with the semiconductor strip 111'.

In some embodiments, the initiator layer 202 includes one or more functional groups. The functional groups may include silane groups, hydroxyl groups, amine groups, one or more other similar groups, one or more other suitable groups, or a combination thereof. The functional groups of the initiator layer 202 allow the initiator layer 202 to be selectively formed on a dielectric material (such as the spacer elements 127 and/or the isolation element 133) without binding to the semiconductor strip 111'. The initiator layer 202 may be formed using a CVD process, an ALD process, a dipping process, one or more other applicable processes, or a combination thereof.

Figure 2B:
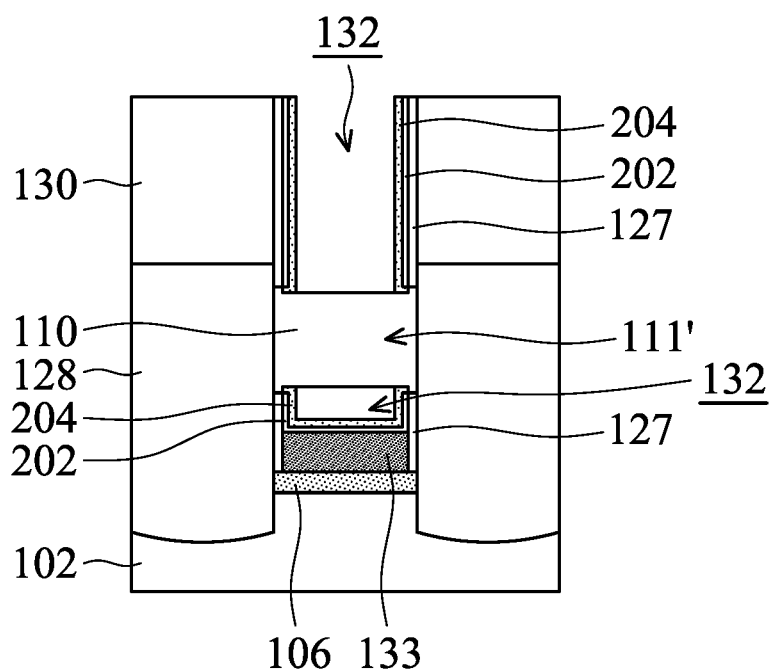

As shown in FIG. 2B, an inhibition material 204 is selectively formed on the initiator layer 202, in accordance with some embodiments. Therefore, similar to the initiator layer 202, the inhibition material 204 is also selectively formed over the interior surfaces of the spacer elements 127. In some embodiments, the inhibition material 204 is substantially not formed on the semiconductor strip 111', as shown in FIG. 2B. In some embodiments, most of the surface of the semiconductor strip 111' is free of the inhibition material 204.

In some embodiments, the inhibition material 204 is also formed on ends of the initiator layer 202 to fill gaps between the initiator layer 202 and the semiconductor strip 111'. In these cases, the inhibition material 204 may be in direct contact with edge portions of the semiconductor strip 111'. However, most of the surface of the semiconductor strip 111' is still free of the inhibition material 204.

In some embodiments, a monomer is introduced on the initiator layer 202 to grow the inhibition material 204 on the initiator layer 202 through a polymerization process. The reaction temperature may be in a range from about 100 degrees C. to about 200 degrees C. In some embodiments, the inhibition material 204 contains carbon and silicon. In some embodiments, the inhibition material 204 is made of or includes a polymer material or a large molecule. The number of repeating units of the polymer material may be in a range from two to ten. The thickness of the inhibition material 204 may be in a range from about 5 Å to about 10 Å.

Figure 2C:
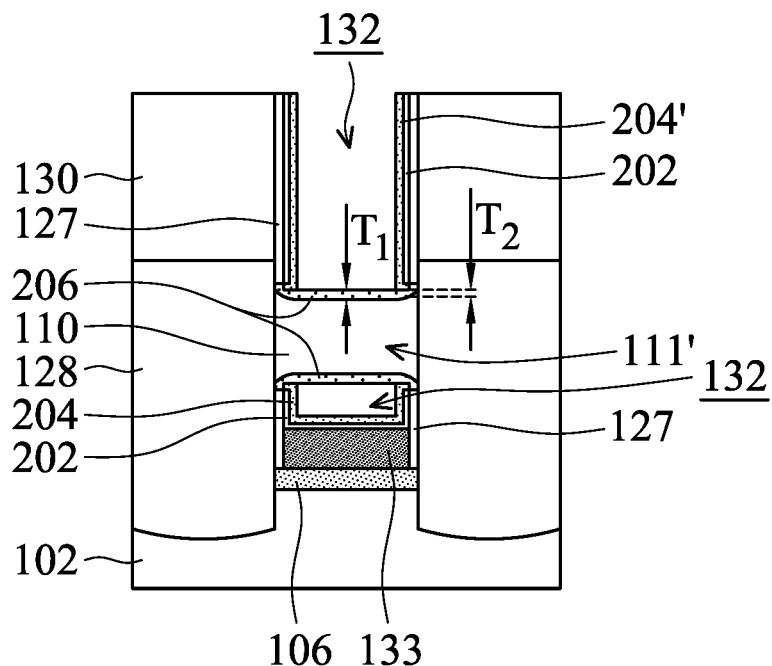

As shown in FIG. 2C, an interfacial layer 206 (or an interfacial region) is formed on the semiconductor strip 111', in accordance with some embodiments. The interfacial layer 206 may be used as a buffer layer or an adhesion layer between the semiconductor strip 111' and a high-k gate dielectric layer that will be formed later.

In some embodiments, the interfacial layer 206 is made of or includes a semiconductor oxide, such as silicon oxide. In some embodiments, an oxygen-containing media is introduced on the semiconductor strip 111'. The oxygen-containing media may react with the semiconductor strip 111'. As a result, a surface portion of the semiconductor strip 111' is oxidized into the interfacial layer 206 (or the interfacial region). The oxygen-containing media may include ozone, water, hydrogen peroxide, one or more other suitable media, or a combination thereof.

As shown in FIG. 2C, the interfacial layer 206 has a first thickness $T_1$ near the center of the interfacial layer 206. The interfacial layer 206 also has a second thickness $T_2$ near an edge portion of the interfacial layer 206. In some embodiments, the first thickness $T_1$ is thicker than the second thickness $T_2$. Due to the block of the initiator layer 202 and the inhibition material 204', the oxygen-containing media is hard to reach the edge portion of the semiconductor stripe 111'. Therefore, the edge portion of the interfacial layer 206 is thinner than the center portion of the interfacial layer 206. However, many variations and/or modifications can be made to embodiments of the disclosure. In some other embodiments, the first thickness $T_1$ and the second thickness $T_2$ are substantially the same. The edge portion of the interfacial layer 206 is substantially as thick as the center portion of the interfacial layer 206.

In some embodiments, during the formation of the interfacial layer 206, the monomer for growing the inhibition material 204 is still introduced at the same time. The oxygen-containing media and the monomer are provided together. In some embodiments, after the interfacial layer 206 is formed, more inhibition material may be grown. As a result, an inhibition material 204' that is thicker than the initially grown inhibition material 204 is formed.

Figure 2D:
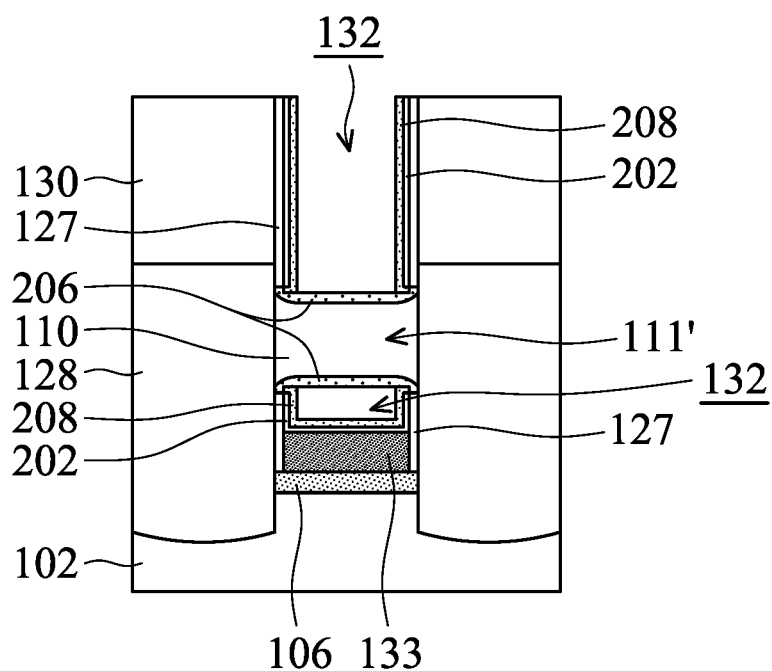

As shown in FIG. 2D, the growth of the inhibition material 204 is terminated, and the inhibition material 204 that has been grown forms an inhibition layer 208, in accordance with some embodiments. In some embodiments, the growth of the inhibition material 204 is terminated with suitable ending groups. The ending groups may include hydrophobic ending groups, such as methyl groups and/or ethyl groups.

As illustrated in the embodiments shown in FIGS. 2B-2D, the interfacial layer 206 is formed after the monomer is introduced on the initiator layer 202 and before the growth of the inhibition material 204 (or 204') is terminated. During the formation of the interfacial layer 206, the inhibition material 204 (or 204') keeps growing to ensure the quality of the inhibition layer 208 obtained. The inhibition layer 208 with good quality facilitates subsequent processes.

Figure 2E:
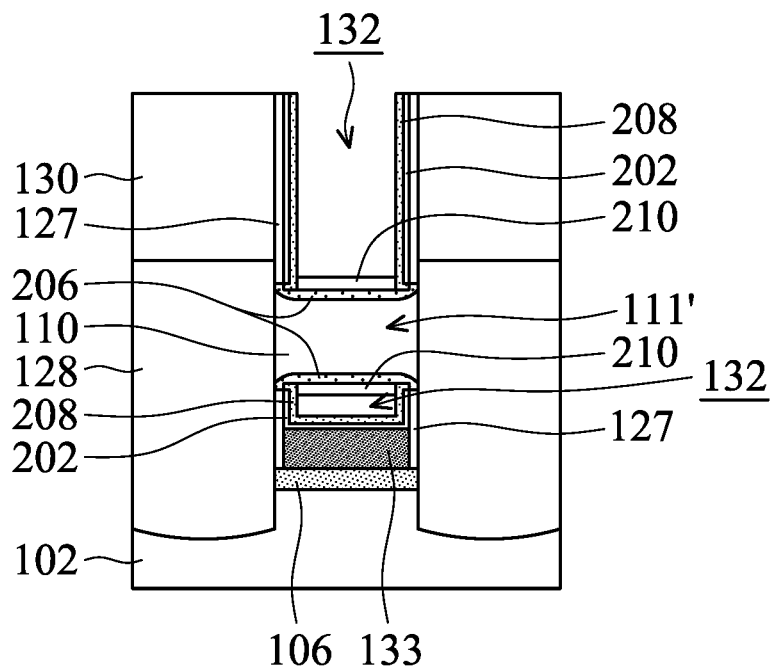

As shown in FIG. 2E, a gate dielectric layer 210 is deposited on the interfacial layer 206, in accordance with some embodiments. The gate dielectric layer 210 surrounds and encircles a portion of the semiconductor strip 111'. The gate dielectric layer 210 selectively covers the semiconductor strip 111'. The gate dielectric layer 210 does not substantially cover the inhibition layer 208, as shown in FIG. 2E. The inhibition layer 208 substantially prevents the gate dielectric layer 210 from being formed on the inhibition layer 208. Since the gate dielectric layer 210 does not substantially extend along the sidewall surfaces of the recess 132, more space is available in the recess 132.

In some embodiments, the gate dielectric layer 210 is a high-k gate dielectric layer that has a greater dielectric constant than that of silicon dioxide. The gate dielectric layer 210 may be made of or include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, one or more other suitable high-K dielectric materials, or a combination thereof. The gate dielectric layer 210 may be deposited using a CVD process, an ALD process, a PVD process, one or more other applicable processes, or a combination thereof.

Figure 2F:
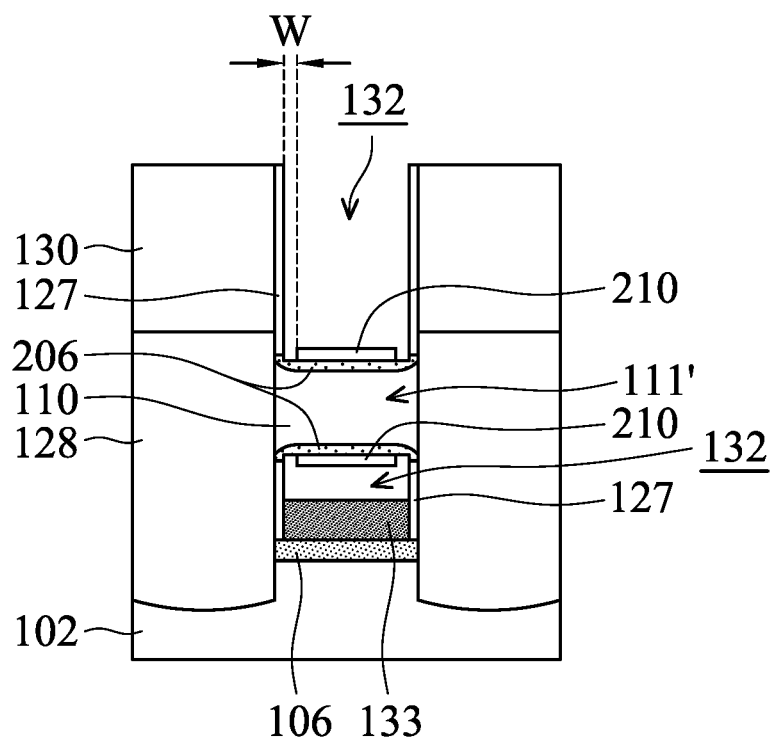

As shown in FIG. 2F, the inhibition layer 208 and the initiator layer 202 are removed, in accordance with some embodiments. As a result, more available space in the recess 132 is obtained, which facilitates subsequent processing. The inhibition layer 208 and the initiator layer 202 may be removed using one or more suitable organic solvents and/or one or more suitable plasma treatments.

As shown in FIG. 2F, an edge of the gate dielectric layer 210 is separated from the sidewall of the recess 132 by a distance W. The distance W corresponds to the thickness of the combination of the inhibition layer 208 and the initiator layer 202. The distance W may be in a range from about 5 Å to about 1 nm.

Figure 2G:
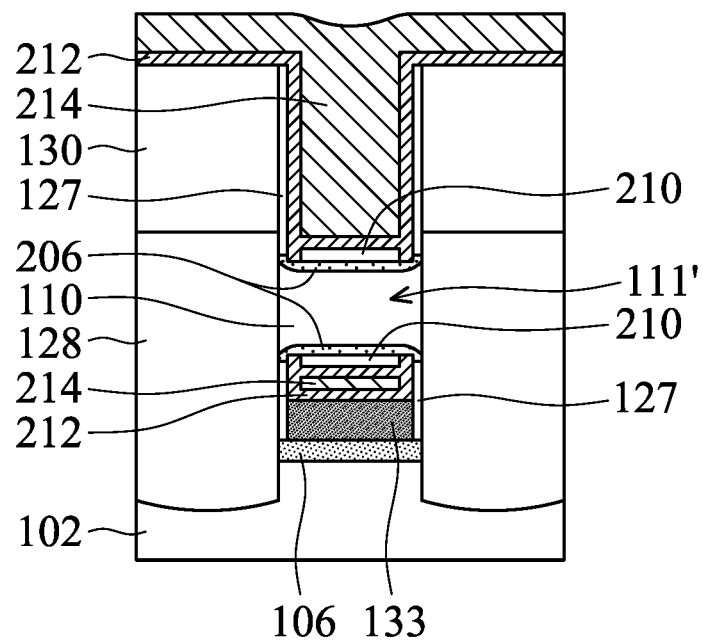

As shown in FIG. 2G, a work function layer 212 is deposited over the structure shown in FIG. 2F, in accordance with some embodiments. The work function layer 212 extends into the recess 132 along the sidewalls of the recess 132. The work function layer 212 further extends over the gate dielectric layer 210 to surround and encircle the semiconductor strip 111'. In some embodiments, the work function layer 212 is in direct contact with the interfacial layer 206.

The work function layer 212 may be used to provide the desired work function for transistors to enhance device performance including improved threshold voltage. In some embodiments, the work function layer 212 is used for forming an NMOS device. The work function layer 212 is an n-type work function layer. The n-type work function layer is capable of providing a work function value suitable for the device, such as equal to or less than about 4.5 eV.

The n-type work function layer may include metal, metal carbide, metal nitride, or a combination thereof. For example, the n-type work function layer includes titanium nitride, tantalum, tantalum nitride, one or more other suitable materials, or a combination thereof. In some embodiments, the n-type work function is an aluminum-containing layer. The aluminum-containing layer may be made of or include TiAlC, TiAlO, TiAlN, one or more other suitable materials, or a combination thereof.

In some embodiments, the work function layer 212 is used for forming a PMOS device. The work function layer 212 is a p-type work function layer. The p-type work function layer is capable of providing a work function value suitable for the device, such as equal to or greater than about 4.8 eV.

The p-type work function layer may include metal, metal carbide, metal nitride, other suitable materials, or a combination thereof. For example, the p-type metal includes tantalum nitride, tungsten nitride, titanium, titanium nitride, other suitable materials, or a combination thereof.

The work function layer 212 may also be made of or include hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combinations thereof. The thickness and/or the compositions of the work function layer 212 may be fine-tuned to adjust the work function level. For example, a titanium nitride layer may be used as a p-type work function layer or an n-type work function layer, depending on the thickness and/or the compositions of the titanium nitride layer.

The work function layer 212 may be deposited using an ALD process, a CVD process, a PVD process, an electroplating process, an electroless plating process, one or more other applicable processes, or a combination thereof.

In some embodiments, a barrier layer is formed before the work function layer 212 to interface the gate dielectric layer 210 with subsequently formed work function layer 212. The barrier layer may also be used to prevent diffusion between the gate dielectric layer 210 and the subsequently formed work function layer 212. The barrier layer may be made of or include a metal-containing material. The metal-containing material may include titanium nitride, tantalum nitride, one or more other suitable materials, or a combination thereof. The barrier layer may be deposited using an ALD process, a CVD process, a PVD process, an electroplating process, an electroless plating process, one or more other applicable processes, or a combination thereof.

Afterwards, a metal filling layer 214 is deposited over the work function layer 212 to fill the recess 132, as shown in FIG. 2G in accordance with some embodiments. The metal filling layer 214 surrounds the semiconductor strip 111'. The metal filling layer 214 may be made of or include tungsten, aluminum, copper, cobalt, one or more other suitable materials, or a combination thereof. The metal filling layer 214 may be deposited using an ALD process, a PVD process, a CVD process, an electroplating process, an electroless plating process, one or more other applicable processes, or a combination thereof.

In some embodiments, a blocking layer is formed over the work function layer 212 before the formation of the metal filling layer 214. The blocking layer may be used to prevent the subsequently formed metal filling layer 214 from diffusing or penetrating into the work function layer 212. The blocking layer may be made of or include tantalum nitride, titanium nitride, one or more other suitable materials, or a combination thereof. The blocking layer may be deposited using an ALD process, a PVD process, an electroplating process, an electroless plating process, one or more other applicable processes, or a combination thereof.

Figure 2H:
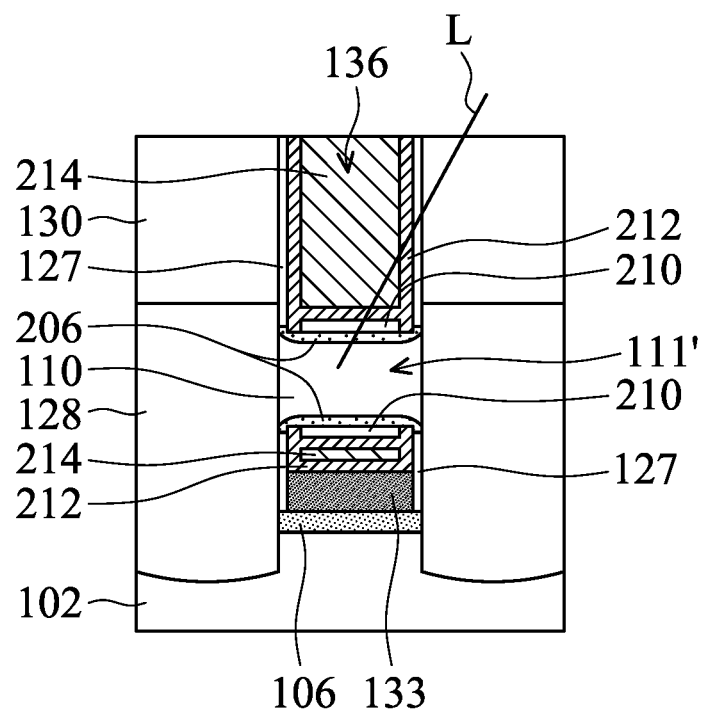

As shown in FIG. 2H, the work function layer 212 and the metal filling layer 214 outside of the recess 132 are removed, in accordance with some embodiments. As a result, the remaining portions of the work function layer 212, the remaining portions of the metal filling layer 214 in the recess 132 together form a metal gate electrode. The metal gate electrode and the gate dielectric layer 210 together form a metal gate stack 136, as shown in FIG. 2H. The metal gate stack 136 surrounds and encircles the semiconductor strip 111'. In some embodiments, a portion of the work function layer 212 is between the gate dielectric layer 210 and the spacer element 127 such as along the line L in FIG. 2H. In some embodiments, the topmost surface of the work function layer 212 is higher than the topmost surface of the gate dielectric layer 210, as shown in FIG. 2H.

The work function layer 212 and the metal filling layer 214 outside of the recess 132 may be removed using a planarization process. The planarization process may include a chemical mechanical polishing (CMP) process, a grinding process, an etching process, a dry polishing process, one or more other applicable processes, or a combination thereof.

As mentioned above, the metal gate stack 136 includes multiple material layers such as the gate dielectric layer 210, the work function layer 212, the metal filling layer 214, the barrier layer, and the blocking layer. By using the inhibition layer 208, the gate dielectric layer 210 is substantially prevented from being formed on the sidewall of the recess 132. Therefore, the filling of the other material layers becomes easier due to the larger space available in the recess 132. The quality and performance of the semiconductor device structure are improved.

Figure 3:
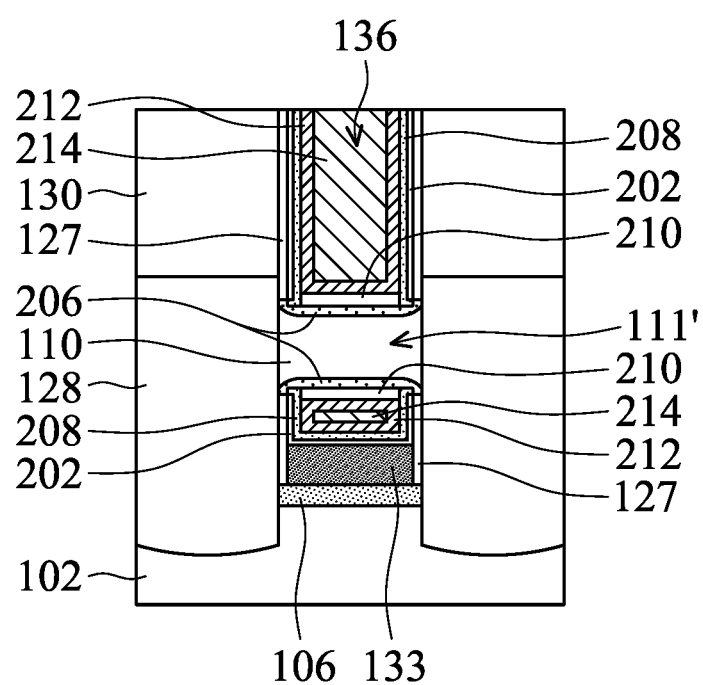
FIG. 3 is a cross-sectional view of a semiconductor device structure, in accordance with some embodiments.

Many variations and/or modifications can be made to embodiments of the disclosure. FIG. 3 is a cross-sectional view of a semiconductor device structure, in accordance with some embodiments. In some embodiments, the initiator layer 202 and the inhibition layer 208 are not removed from the recess 132 before the formation of the work function layer 212. Since the initiator layer 202 and the inhibition layer 208 are very thin, the filling of the other material layers still becomes easier due to the larger space available in the recess 132. In some embodiments, the inhibition layer 208 are in direct contact with the gate dielectric layer 210 and the interfacial layer 206, as shown in FIG. 3. In some embodiments, the inhibition layer 208 extends upwards from the bottom surface of the gate dielectric layer towards the top surface of the work function layer 212. In some embodiments, the inhibition layer 208 is between the work function layer 212 and the spacer element 127.

In some embodiments mentioned above, each of the source/drain structures 128 is in direct contact with multiple semiconductor strips 111'. The semiconductor device structure thus has a "merged scheme", as shown in FIG. 1O. However, many variations and modifications can be made to embodiments of the disclosure. In some other embodiments, each of the source/drain structures 128 may be in direct contact with only one semiconductor strip (fin channel structure).

Figure 4:
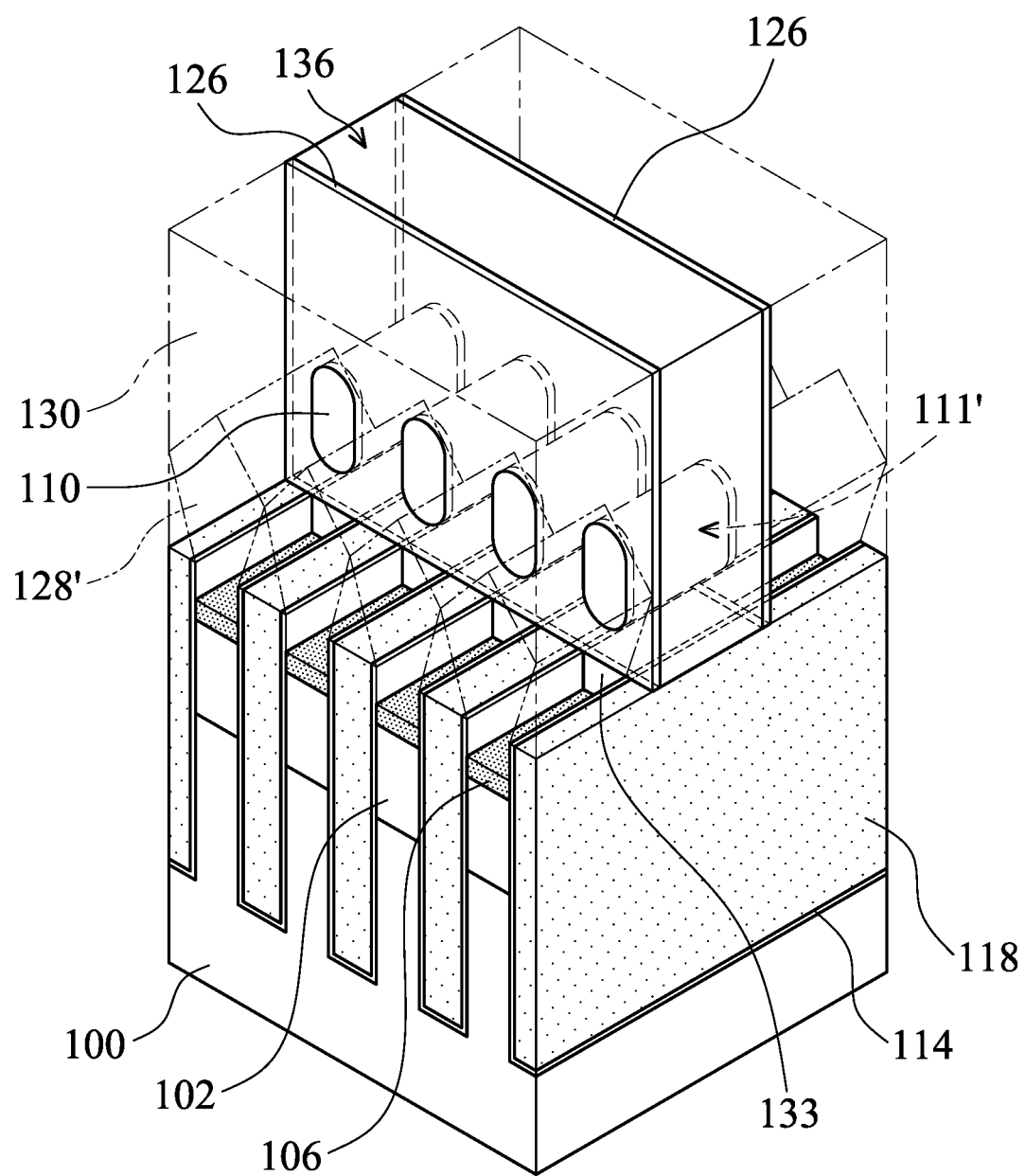
FIG. 4 is a perspective view of a semiconductor device structure, in accordance with some embodiments.

FIG. 4 is a perspective view of a semiconductor device structure, in accordance with some embodiments. As shown in FIG. 4, multiple source/drain structures 128' are formed, in accordance with some embodiments. The source/drain structures 128' are illustrated as dashed lines in FIG. 4 for a better understanding of the structure. In these cases, each of the semiconductor strips 111' is in direct contact with one corresponding source/drain structure 128'.

Many variations and/or modifications can be made to embodiments of the disclosure. FIGS. 5A-5F are cross-sectional views of various stages of a process for forming a semiconductor device structure, in accordance with some embodiments.

Figure 5A:
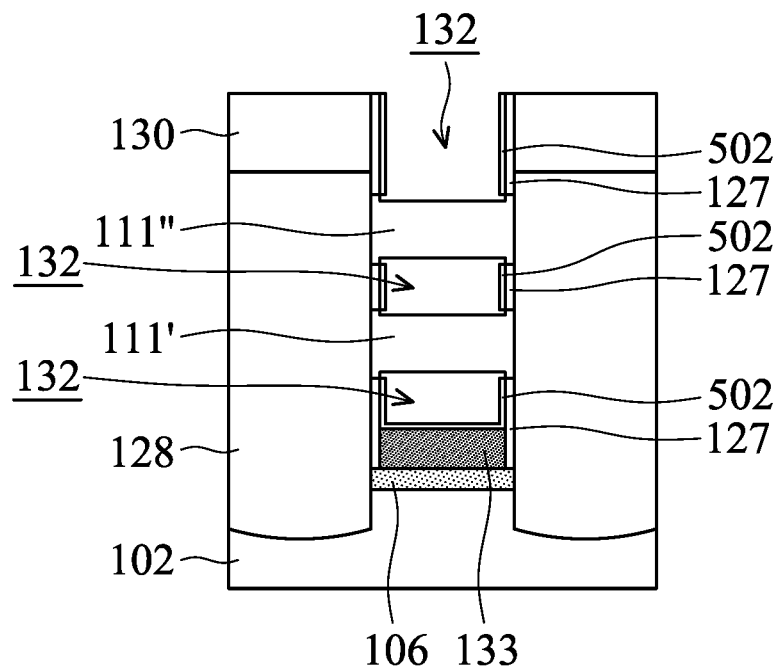
FIGS. 5A-5F are cross-sectional views of various stages of a process for forming a semiconductor device structure, in accordance with some embodiments.

As shown in FIG. 5A, a structure similar to that shown in FIG. 2A is formed. In some embodiments, two or more semiconductor strips (such as semiconductor strips 111' and 111") are formed between the source/drain structures 128. In some embodiments, two or more stacks of the semiconductor layers 108 and 110 are formed over the semiconductor substrate 100. Afterwards, processes similar to those shown in FIGS. 1C-1N and FIGS. 1N-1 are performed.

In some embodiments, a cleaning operation is used to remove native oxide grown on the surface of the semiconductor strips 111' and 111", in accordance with some embodiments. For example, a dilute hydrofluoric acid (DHF) is used for removing the native oxide. In some other embodiments, the cleaning operation illustrated in FIGS. 1N and 1N-1 also removes the native oxide grown on the surface of the semiconductor strips 111' and 111". In these cases, the cleaning operation illustrated in FIG. 5A may not be performed. However, in some other embodiments, the cleaning operation illustrated in FIG. 5A is performed to ensure a clean removal of the native oxide grown on the semiconductor strips 111' and 111".

Afterwards, an initiator layer 502 is formed on the interior surfaces of the spacer elements 127 and on the isolation element 133. The structure shown in FIG. 5A is thus formed.

The material and formation method of the initiator layer 502 may be the same as or similar to those of the initiator layer 202 illustrated in FIG. 2A.

Figure 5B:
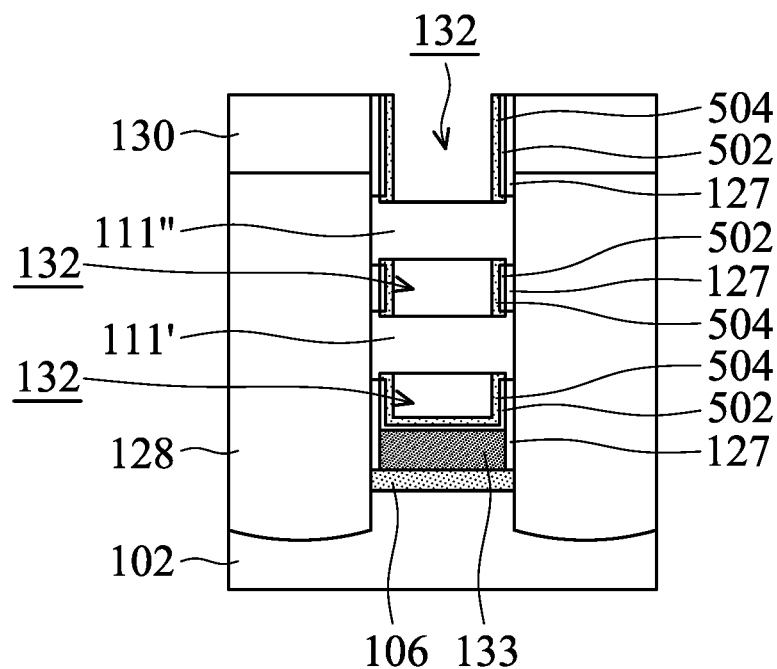

As shown in FIG. 5B, an inhibition layer 504 is selectively formed on the initiator layer 502, in accordance with some embodiments. In some embodiments, the inhibition layer 504 is substantially not formed on the semiconductor strips 111' and 111", as shown in FIG. 5B. In some embodiments, most of the surfaces of the semiconductor strips 111' and 111" are free of the inhibition layer 504.

In some embodiments, the inhibition layer 504 is also formed on ends of the initiator layer 502 to fill gaps between the initiator layer 502 and the semiconductor strip 111' or 111". In these cases, the inhibition layer 504 may be in direct contact with edge portions of the semiconductor strips 111' and 111". However, most of the surfaces of the semiconductor strips 111' and 111" are still free of the inhibition layer 504. The inhibition layer 504 is substantially not formed on the semiconductor strips 111' and 111".

In some embodiments, a monomer is introduced on the initiator layer 502 to grow the inhibition layer 504 on the initiator layer 502 through a polymerization process. The reaction temperature may be in a range from about 100 degrees C. to about 200 degrees C. In some embodiments, the inhibition layer 504 is made of or includes a polymer material or a large molecule. The number of repeating units of the polymer material may be in a range from two to ten. The thickness of the inhibition layer 504 may be in a range from about 5 Å to about 10 Å.

Afterwards, the polymerization process for growing of the inhibition layer 504 is terminated to complete the formation of the inhibition layer 504, in accordance with some embodiments. In some embodiments, the growth of the inhibition layer 504 is terminated with suitable ending groups. The ending groups may include hydrophobic ending groups, such as methyl groups and/or ethyl groups.

Figure 5C:
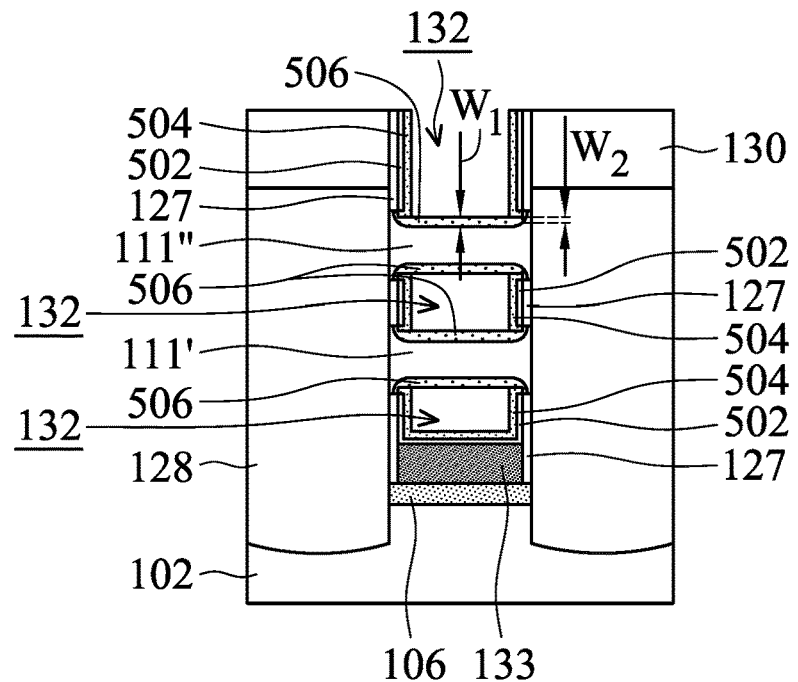

As shown in FIG. 5C, an interfacial layer 506 (or an interfacial region) is formed on the semiconductor strips 111' and 111", in accordance with some embodiments. The interfacial layer 506 may be used as a buffer layer or an adhesion layer between the semiconductor strip 111' (or 111") and a high-k gate dielectric layer that will be formed later.

In some embodiments, the interfacial layer 506 is made of or includes a semiconductor oxide, such as silicon oxide. In some embodiments, an oxygen-containing media is introduced on the semiconductor strips 111' and 111". The oxygen-containing media may react with the semiconductor strips 111' and 111". As a result, surface portions of the semiconductor strips 111' and 111" are oxidized into the interfacial layer 506 (or the interfacial region). The oxygen-containing media may include water, hydrogen peroxide, ozone, one or more other suitable media, or a combination thereof.

As shown in FIG. 5C, the interfacial layer 506 has a first thickness $W_1$ near the center of the interfacial layer 506. The interfacial layer 506 also has a second thickness $W_2$ near an edge portion of the interfacial layer 506. In some embodiments, the first thickness $W_1$ is thicker than the second thickness $W_2$. Due to the block of the initiator layer 502 and the inhibition layer 504, the oxygen-containing media is hard to reach the edge portions of the semiconductor stripes 111' and 111". Therefore, the edge portion of the interfacial layer 506 is thinner than the center portion of the interfacial layer 506. However, many variations and/or modifications can be made to embodiments of the disclosure. In some other embodiments, the first thickness $W_1$ and the second thickness $W_2$ are substantially the same. The edge portion of the interfacial layer 506 is substantially as thick as the center portion of the interfacial layer 506.

In some embodiments, an edge of the interfacial layer 506 is separated from the source/drain structure 128 that is nearby by a distance, as shown in FIG. 5C. However, in some other embodiments, the edge of the interfacial layer 506 is in direct contact with the source/drain structure 128 that is nearby.

Figure 5D:
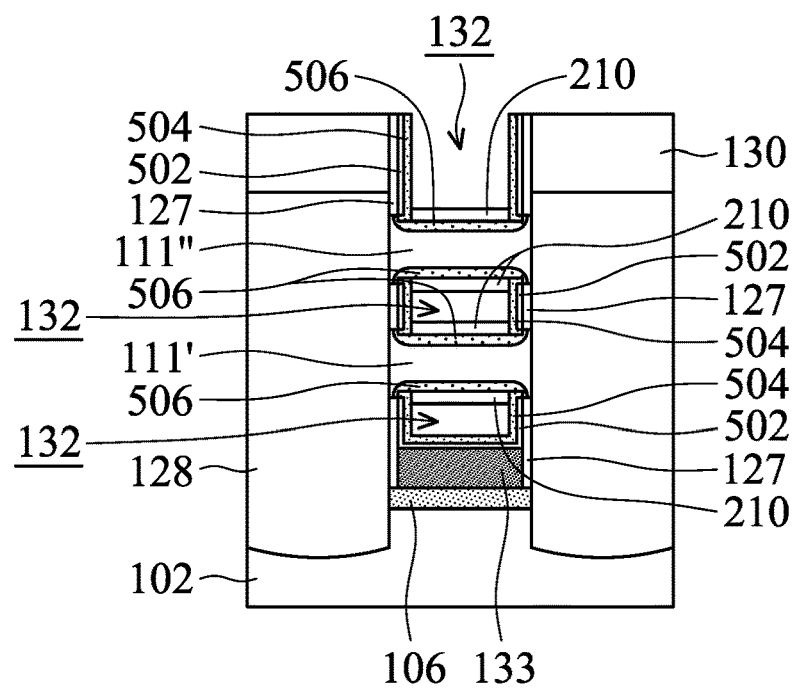

As shown in FIG. 5D, a gate dielectric layer 210 is deposited on the interfacial layer 506, in accordance with some embodiments. The gate dielectric layer 210 surrounds and encircles portions of the semiconductor strip 111' and 111". The gate dielectric layer 210 selectively covers the semiconductor strips 111' and 111". The gate dielectric layer 210 does not substantially cover the inhibition layer 504, as shown in FIG. 5D. The inhibition layer 504 substantially prevents the gate dielectric layer 210 from being formed on the inhibition layer 504. Since the gate dielectric layer 210 does not substantially extend along the sidewall surfaces of the recess 132, more space is available in the recess 132. The material and formation method of the gate dielectric layer 210 may be the same as or similar to those of the gate dielectric layer 210 illustrated in FIG. 2E.

Figure 5E:
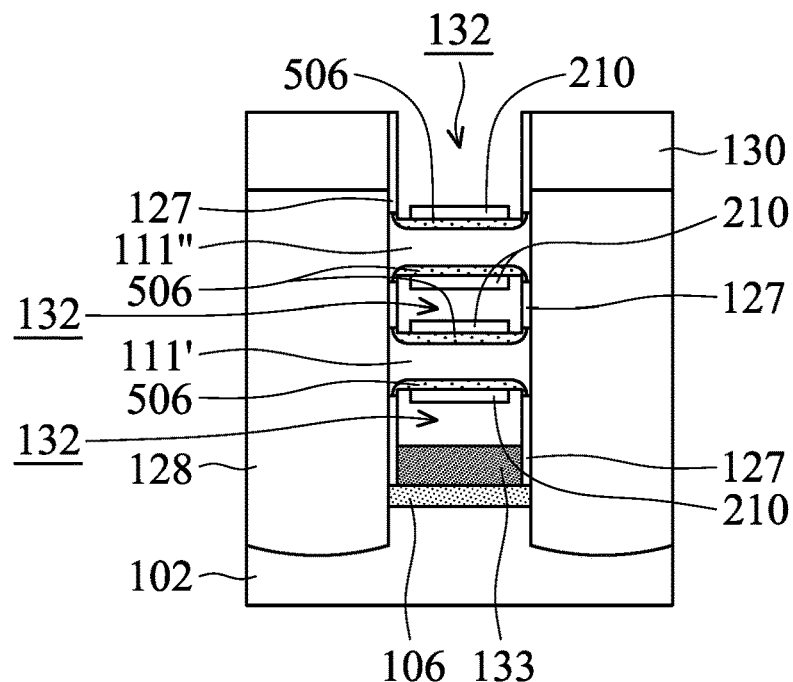

As shown in FIG. 5E, the inhibition layer 504 and the initiator layer 502 are removed, in accordance with some embodiments. As a result, more space is available in the recess 132, which facilitates subsequent processing. The inhibition layer 504 and the initiator layer 502 may be removed using one or more suitable organic solvents and/or one or more suitable plasma treatments.

Figure 5F:
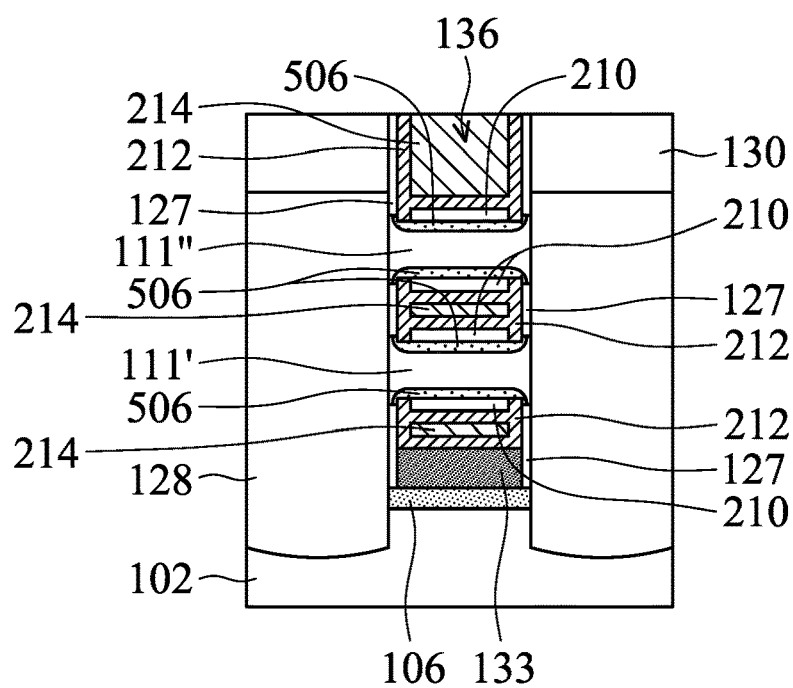

As shown in FIG. 5F, similar to the embodiments illustrated in FIGS. 2G and 2H, the work function layer 212 and the metal filling layer 214 are formed to fill the recess 132, in accordance with some embodiments. The work function layer 212 and the metal filling layer 214 may together function as a metal gate electrode. The metal gate electrode and the gate dielectric layer 210 together form the gate stack 136. The materials and formation methods of the gate stack 136 may be the same as or similar to those of the gate stack 136 illustrated in FIGS. 2G and 2H.

Figure 6:
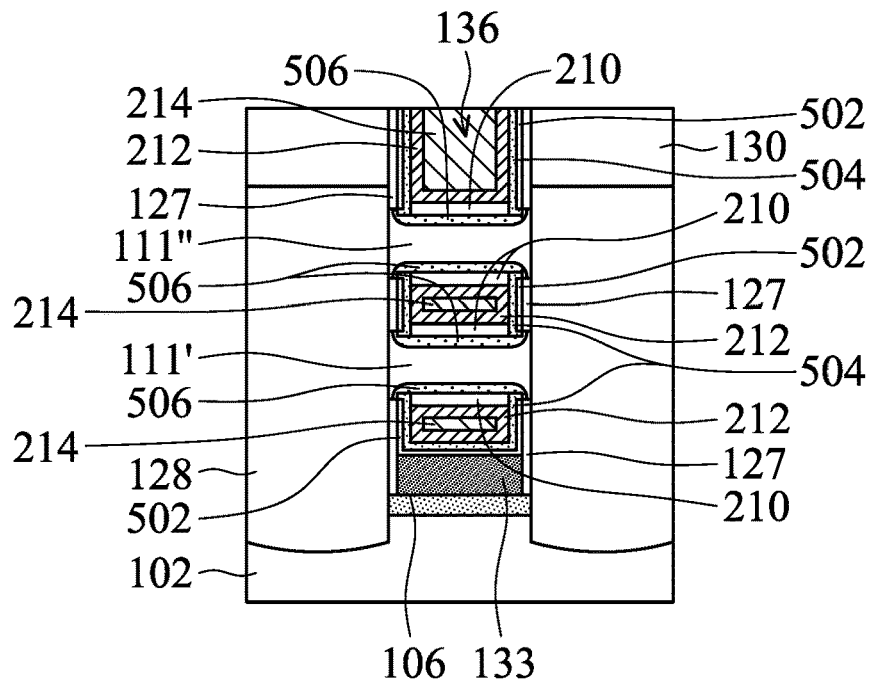
FIG. 6 is a cross-sectional view of a semiconductor device structure, in accordance with some embodiments.

Many variations and/or modifications can be made to embodiments of the disclosure. FIG. 6 is a cross-sectional view of a semiconductor device structure, in accordance with some embodiments. In some embodiments, the initiator layer 502 and the inhibition layer 504 are not removed from the recess 132 before the formation of the metal gate electrode including the work function layer 212 and the metal filling layer 214. Since the initiator layer 502 and the inhibition layer 504 are very thin, the filling of the other material layers still becomes easier due to there being more space available in the recess 132. In some embodiments, the inhibition layer 504 is in direct contact with the gate dielectric layer 210 and the interfacial layer 506, as shown in FIG. 6.

Figure 7A:
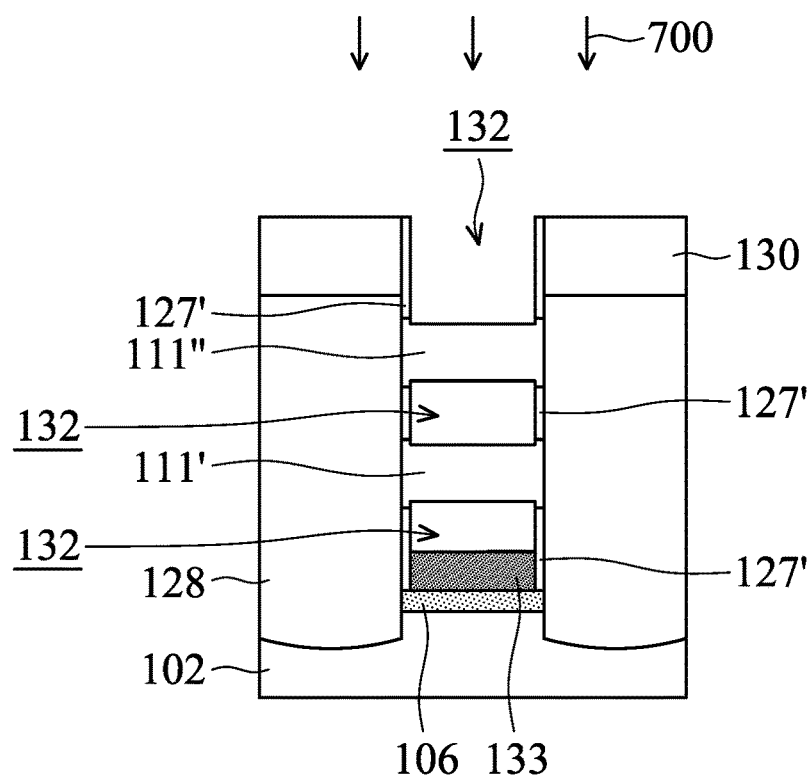
FIGS. 7A-7D are cross-sectional views of various stages of a process for forming a semiconductor device structure, in accordance with some embodiments.

Many variations and/or modifications can be made to embodiments of the disclosure. FIGS. 7A-7D are cross-sectional views of various stages of a process for forming a semiconductor device structure, in accordance with some embodiments. As shown in FIG. 7A, a structure similar to that shown in FIG. 5A is provided or formed. Different from the embodiments shown in FIG. 5A, no initiator layer is formed.

As shown in FIG. 7A, a modification process 700 is used to modify the interior surface to form modified spacer elements 127', in accordance with some embodiments. In some embodiments, the modification process 700 involves introducing one or more silylation regents on the interior surface of the spacer elements 127. As a result, the modified spacer elements 127' are formed. In some embodiments, the one or more silylation regents selectively react with the interior surfaces of the spacer elements, and substantially do not react with the semiconductor strips 111' and 111". The one or more silylation regents may include hexamethyldisilazane, N, N-dimethyltrimethylsilylamine, chlorotrimethylsilane, one or more other suitable modifying reagents, or a combination thereof.

In some embodiments, a cleaning operation is used to remove native oxide grown on the surface of the semiconductor strips 111' and 111" before the modification process 700, in accordance with some embodiments. For example, a dilute hydrofluoric acid is used for removing the native oxide. In some other embodiments, the cleaning operation illustrated in FIGS. 1N and 1N-1 also removes the native oxide grown on the surface of the semiconductor strips 111' and 111". In these cases, the cleaning operation illustrated in FIG. 7A may not be performed. However, in some other embodiments, the cleaning operation illustrated in FIG. 7A is performed to ensure a clean removal of the native oxide grown on the semiconductor strips 111' and 111".

Figure 7B:
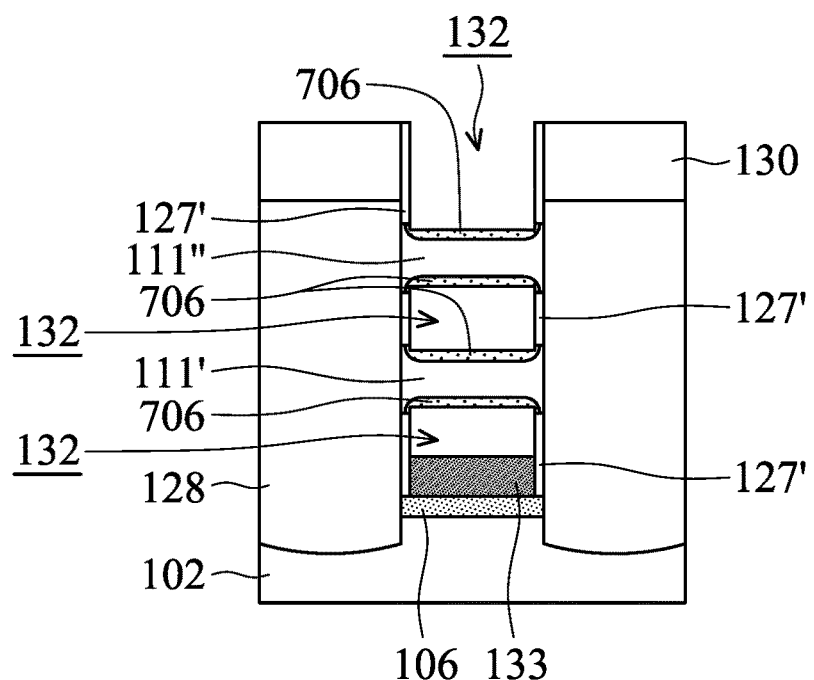

As shown in FIG. 7B, an interfacial layer 706 (or an interfacial region) is formed on the semiconductor strips 111' and 111", in accordance with some embodiments. The interfacial layer 706 may be used as a buffer layer or an adhesion layer between the semiconductor strip 111' (or 111") and a high-k gate dielectric layer that will be formed later.

In some embodiments, the interfacial layer 706 is made of or includes a semiconductor oxide, such as silicon oxide. In some embodiments, an oxygen-containing media is introduced on the semiconductor strips 111' and 111". The oxygen-containing media may react with the semiconductor strips 111' and 111". As a result, surface portions of the semiconductor strips 111' and 111" are oxidized into the interfacial layer 706 (or the interfacial region). The oxygen-containing media may include water, hydrogen peroxide, one or more other suitable media, or a combination thereof.

Due to the block of the modified spacer elements 127', the oxygen-containing media is hard to reach the edge portions of the semiconductor stripes 111' and 111". Therefore, the edge portion of the interfacial layer 706 is thinner than the center portion of the interfacial layer 706, as shown in FIG. 7B. However, many variations and/or modifications can be made to embodiments of the disclosure. In some other embodiments, the edge portion of the interfacial layer 706 is substantially as thick as the center portion of the interfacial layer 706. In some embodiments, an edge of the interfacial layer 706 is separated from the source/drain structure 128 that is nearby by a distance, as shown in FIG. 7B. However, in some other embodiments, the edge of the interfacial layer 706 is in direct contact with the source/drain structure 128 that is nearby.

Figure 7C:
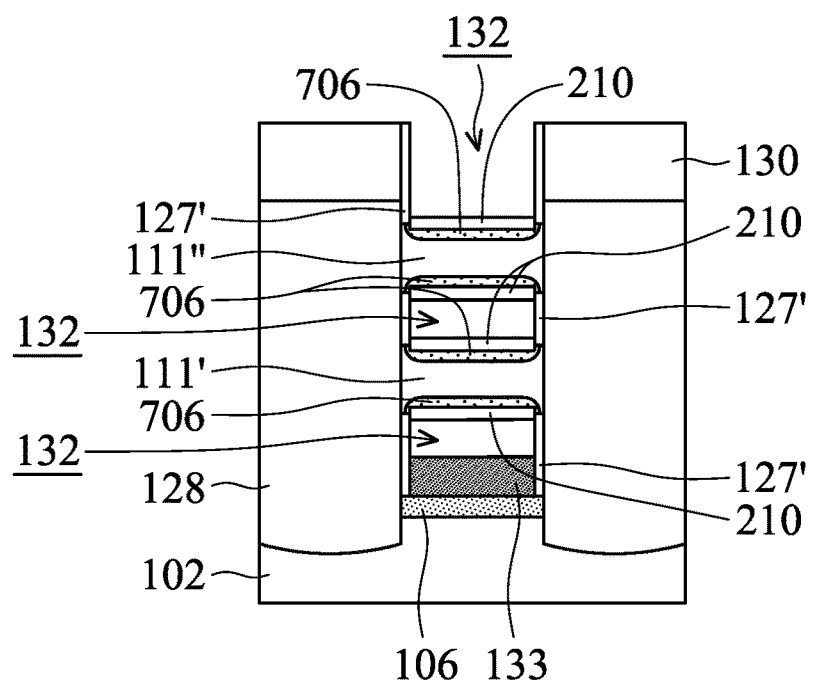

As shown in FIG. 7C, a gate dielectric layer 210 is deposited on the interfacial layer 706, in accordance with some embodiments. The gate dielectric layer 210 surrounds and encircles portions of the semiconductor strip 111' and 111". The gate dielectric layer 210 selectively covers the semiconductor strips 111' and 111". The gate dielectric layer 210 does not substantially cover the modified spacer elements 127', as shown in FIG. 7C. The modified interior surfaces of the modified spacer elements 127' substantially prevent the gate dielectric layer 210 from being formed on the modified interior surfaces. Since the gate dielectric layer 210 does not substantially extend along the sidewall surfaces of the recess 132, more space is obtained in the recess 132. The material and formation method of the gate dielectric layer 210 may be the same as or similar to those of the gate dielectric layer 210 illustrated in FIG. 2E.

Figure 7D:
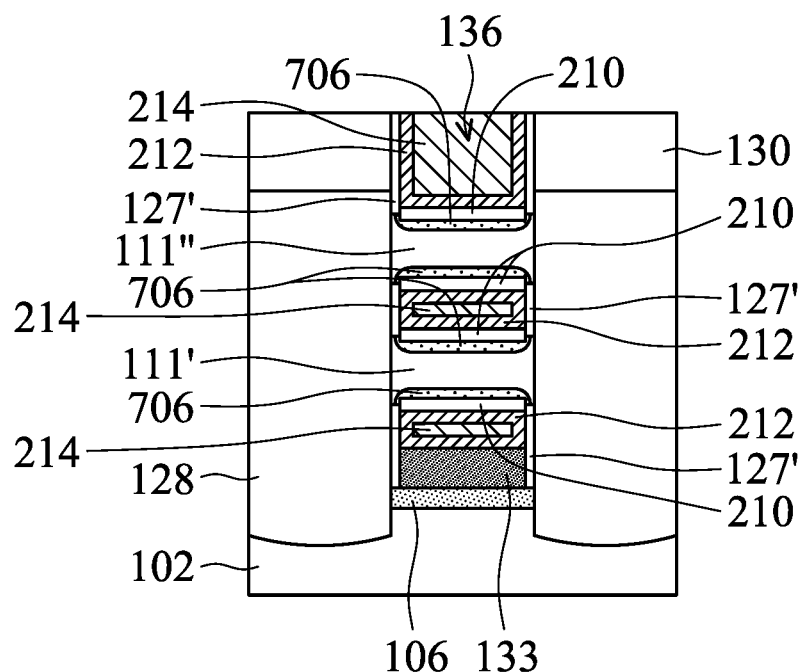

As shown in FIG. 7D, similar to the embodiments illustrated in FIGS. 2G and 2H, the work function layer 212 and the metal filling layer 214 are formed to fill the recess 132, in accordance with some embodiments. The work function layer 212 and the metal filling layer 214 may together function as a metal gate electrode. The metal gate electrode and the gate dielectric layer 210 together form the gate stack 136. The materials and formation methods of the gate stack 136 may be the same as or similar to those of the gate stack 136 illustrated in FIGS. 2G and 2H.

Many variations and/or modifications can be made to embodiments of the disclosure. FIGS. 8A-8F are cross-sectional views of various stages of a process for forming a semiconductor device structure, in accordance with some embodiments.

Figure 8A:
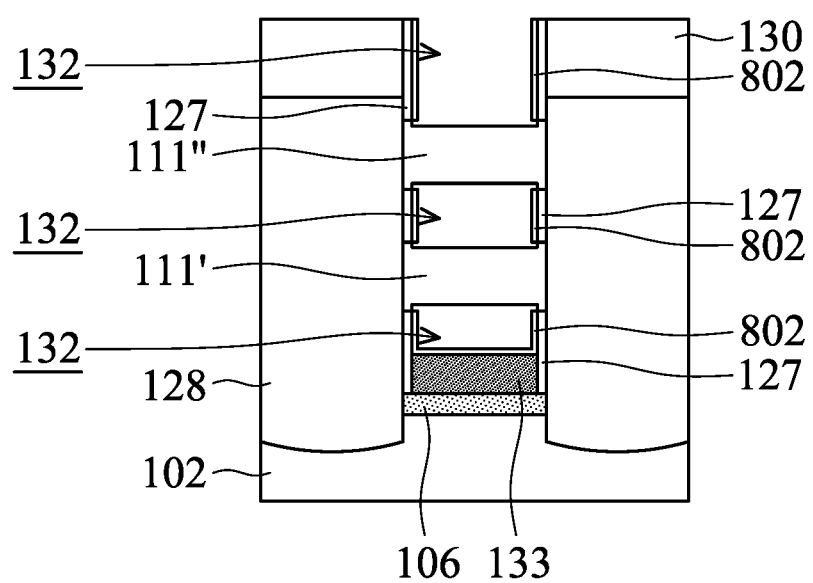
FIGS. 8A-8F are cross-sectional views of various stages of a process for forming a semiconductor device structure, in accordance with some embodiments.

As shown in FIG. 8A, an inhibition material 802 is formed on the interior surfaces of the spacer elements 127, in accordance with some embodiments. The inhibition material 802 selectively bonds to the interior surfaces of the spacer elements 127.

In some embodiments, the inhibition material 802 includes multiple self-aligned monolayers that are made of or include octadecyltrichlorosilane, trichloro(1H, 1H, 2H, 2H-perfluorooctyl)silane, one or more other suitable materials, or a combination thereof. In some embodiments, the inhibition material 802 includes polymer brushes that are made of or include hydroxyl polystyrene, hydroxyl poly (methyl-methacrylate), one or more other suitable materials, or a combination thereof. In some embodiments, the inhibition material 802 is made of or includes self-aligned monolayers, polymer brushes, one or more other suitable materials, or a combination thereof. The inhibition material 802 may be formed using a CVD process, an ALD process, one or more other applicable processes, or a combination thereof.

Figure 8B:
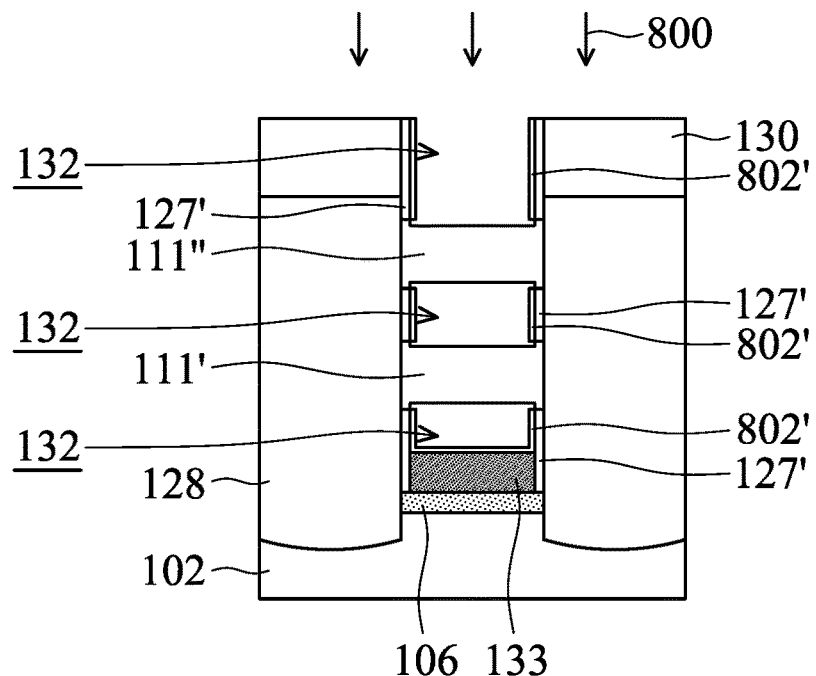

As shown in FIG. 8B, an operation 800 is applied on the inhibition material 802 to induce cross-linking of molecules in the inhibition material 802, in accordance with some embodiments. As a result, the inhibition material 802 is transformed into an inhibition layer 802' that includes cross-linked molecules.

The operation 800 may include an ultraviolet (UV) curing operation, a plasma treatment operation, a thermal operation, one or more other applicable operations, or a combination thereof. The UV light used in the UV curing operation may have a wavelength that is in a range from about 200 nm to about 400 nm. The plasma treatment operation may involve using remote plasma. Reaction gas used in the plasma treatment operation may include hydrogen, argon, one or more other suitable gases, or a combination thereof.

Figure 8C:
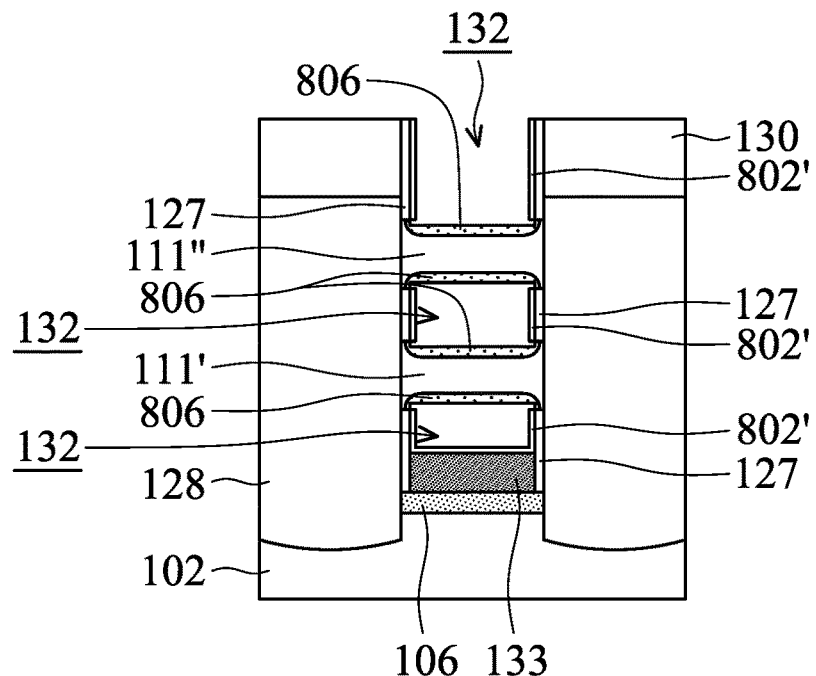

As shown in FIG. 8C, an interfacial layer 806 (or an interfacial region) is formed on the semiconductor strips 111' and 111", in accordance with some embodiments. The interfacial layer 806 may be used as a buffer layer or an adhesion layer between the semiconductor strip 111' (or 111") and a high-k gate dielectric layer that will be formed later.

In some embodiments, the interfacial layer 806 is made of or includes a semiconductor oxide, such as silicon oxide. In some embodiments, an oxygen-containing media is introduced on the semiconductor strips 111' and 111". The oxygen-containing media may react with the semiconductor strips 111' and 111". As a result, surface portions of the semiconductor strips 111' and 111" are oxidized into the interfacial layer 806 (or the interfacial region). The oxygen-containing media may include water, hydrogen peroxide, ozone, one or more other suitable media, or a combination thereof.

Due to the block of the inhibition layer 802', the oxygen-containing media is hard to reach the edge portions of the semiconductor stripes 111' and 111". Therefore, the edge portion of the interfacial layer 806 is thinner than the center portion of the interfacial layer 806. However, in some other embodiments, the edge portion of the interfacial layer 806 is substantially as thick as the center portion of the interfacial layer 806.

In some embodiments, an edge of the interfacial layer 806 is separated from the source/drain structure 128 that is nearby by a distance, as shown in FIG. 8C. However, in some other embodiments, the edge of the interfacial layer 806 is in direct contact with the source/drain structure 128 that is nearby.

Figure 8D:
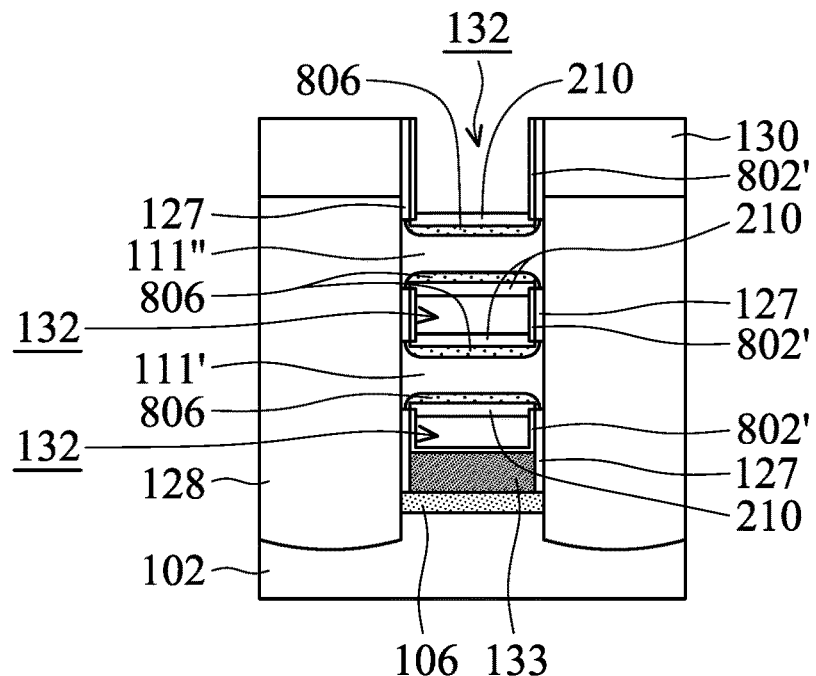

As shown in FIG. 8D, a gate dielectric layer 210 is deposited on the interfacial layer 806, in accordance with some embodiments. The gate dielectric layer 210 surrounds and encircles portions of the semiconductor strip 111' and 111". The gate dielectric layer 210 selectively covers the semiconductor strips 111' and 111". The gate dielectric layer 210 does not substantially cover the inhibition layer 802', as shown in FIG. 8D. The inhibition layer 802' substantially prevents the gate dielectric layer 210 from being formed on the inhibition layer 802'. Since the gate dielectric layer 210 does not substantially extend along the sidewall surfaces of the recess 132, more space available in the recess 132 is obtained. The material and formation method of the gate dielectric layer 210 may be the same as or similar to those of the gate dielectric layer 210 illustrated in FIG. 2E.

Figure 8E:
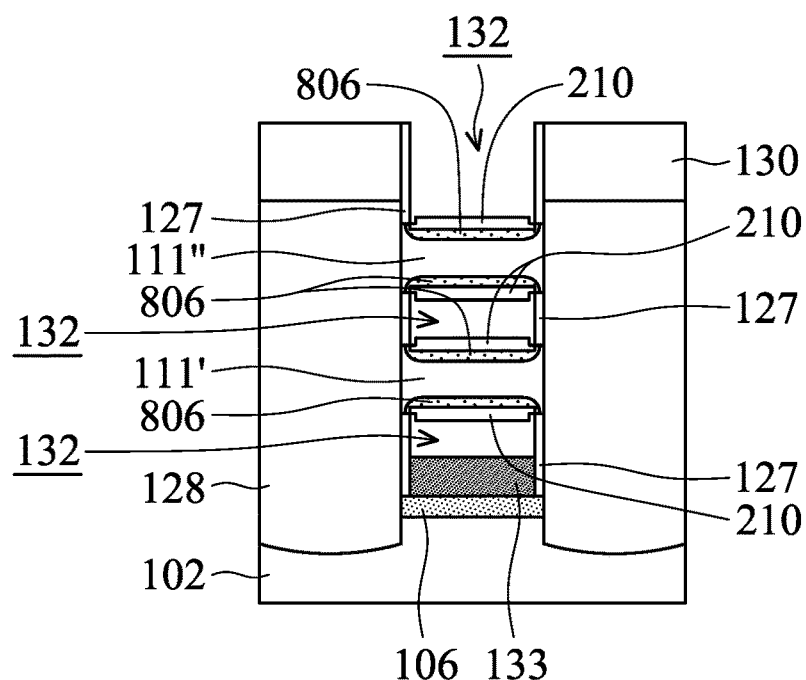

As shown in FIG. 8E, the inhibition layer 802' is removed, in accordance with some embodiments. As a result, more space available in the recess 132 is obtained, which facilitates subsequent processing. The inhibition layer 802' may be removed using one or more suitable organic solvents and/or one or more suitable plasma treatments.

Figure 8F:
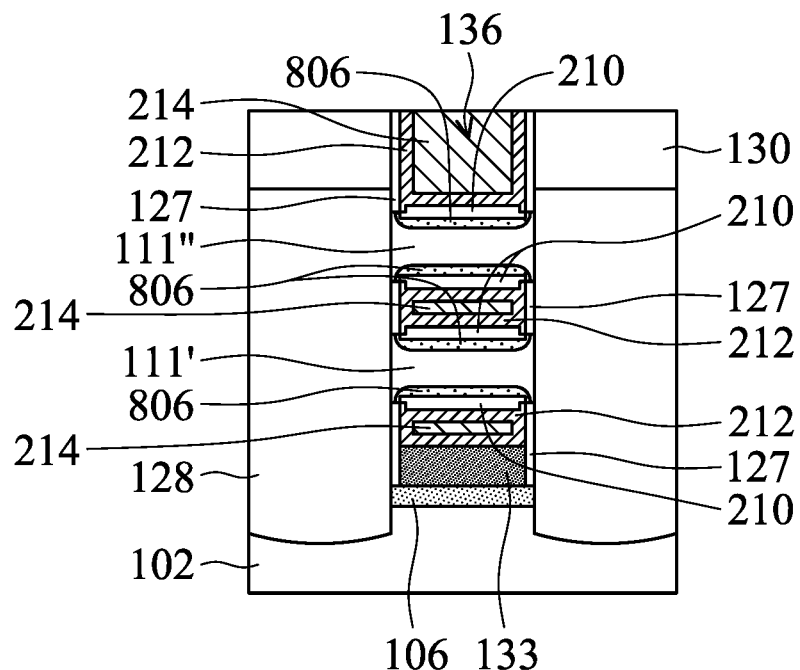

As shown in FIG. 8F, similar to the embodiments illustrated in FIGS. 2G and 2H, the work function layer 212 and the metal filling layer 214 are formed to fill the recess 132, in accordance with some embodiments. The work function layer 212 and the metal filling layer 214 may together function as a metal gate electrode. The metal gate electrode and the gate dielectric layer 210 together form the gate stack 136. The materials and formation methods of the gate stack 136 may be the same as or similar to those of the gate stack 136 illustrated in FIGS. 2G and 2H. In some embodiments, the work function layer 212 has a protruding portion that extends into the gate dielectric layer 210, as shown in FIG. 8F.

Figure 9:
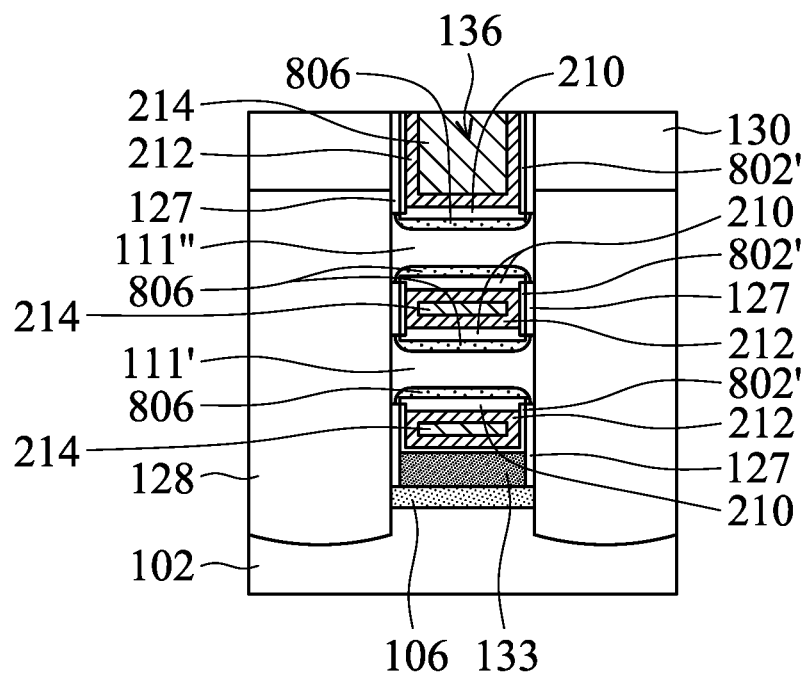
FIG. 9 is a cross-sectional view of a semiconductor device structure, in accordance with some embodiments.

Many variations and/or modifications can be made to embodiments of the disclosure. FIG. 9 is a cross-sectional view of a semiconductor device structure, in accordance with some embodiments. In some embodiments, the inhibition layer 802' is not removed from the recess 132 before the formation of the metal gate electrode including the work function layer 212 and the metal filling layer 214. Since the inhibition layer 802' is very thin, the filling of the other material layers still becomes easier due to there being more space available in the recess 132. In some embodiments, the inhibition layer 802' is in direct contact with the gate dielectric layer 210, as shown in FIG. 9. In some embodiments, the inhibition layer 802' is separated from the interfacial layer 806 by the gate dielectric layer 210, as shown in FIG. 9.

Many variations and/or modifications can be made to embodiments of the disclosure. In some other embodiments, the inhibition layer is used in a non-FinFET application.

Embodiments of the disclosure form a semiconductor device structure using a gate replacement process. Embodiments of the disclosure form an inhibition layer on interior surfaces of spacer elements or modify the interior surfaces of the spacer elements. The inhibition layer or the modified interior surfaces helps to prevent a subsequently formed gate dielectric layer from extending along sidewalls of a recess between the spacer elements. As a result, more space is available in the recess. The subsequent filling process for forming a metal gate stack becomes easier due to larger space in the recess. Therefore, the reliability and quality of the semiconductor device structure are significantly improved.

In accordance with some embodiments, a method for forming a semiconductor device structure is provided. The method includes forming a dummy gate stack over a semiconductor substrate and forming a spacer element over a sidewall of the dummy gate stack. The method also includes removing the dummy gate stack to form a recess exposing a semiconductor strip and forming an inhibition layer over an interior surface of the spacer element. The method further includes forming a gate dielectric layer in the recess to selectively cover the semiconductor strip. The inhibition layer substantially prevents the gate dielectric layer from being formed on the inhibition layer. In addition, the method includes forming a metal gate electrode over the gate dielectric layer.

In accordance with some embodiments, a method for forming a semiconductor device structure is provided. The method includes forming a dummy gate stack over a semiconductor substrate and forming a spacer element over a sidewall of the dummy gate stack. The method also includes removing the dummy gate stack to form a recess exposing a semiconductor strip and modifying an interior surface of the spacer element. The method further includes forming a gate dielectric layer in the recess to selectively cover the semiconductor strip. The interior surface of the spacer element that is modified substantially prevents the gate dielectric layer from bonding to the inhibition layer. In addition, the method includes forming a metal gate electrode over the gate dielectric layer.

In accordance with some embodiments, a semiconductor device structure is provided. The semiconductor device structure includes a semiconductor strip over a semiconductor substrate. The semiconductor device structure also includes two epitaxial structures over the semiconductor substrate. The semiconductor strip is between the epitaxial structures. The semiconductor device structure further includes a metal gate stack partially covering the semiconductor strip. The metal gate stack includes a gate dielectric layer and a work function layer, and the gate dielectric layer is between the work function layer and the semiconductor strip. In addition, the semiconductor device structure includes a spacer element extending along a sidewall of the metal gate stack. A portion of the work function layer is between the gate dielectric layer and the spacer element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
   forming a dummy gate stack over a semiconductor substrate;
   forming a spacer element over a sidewall of the dummy gate stack;
   removing the dummy gate stack to form a recess exposing a semiconductor strip;
   forming an inhibition layer over an interior surface of the spacer element after forming the spacer element, wherein the inhibition layer fully covers the interior surface of the spacer element;
   forming a gate dielectric layer in the recess to selectively cover the semiconductor strip, wherein the inhibition layer substantially prevents the gate dielectric layer from being formed on the inhibition layer, and the inhibition layer separates the gate dielectric layer from the spacer element; and
   forming a metal gate electrode over the gate dielectric layer.

2. The method for forming a semiconductor device structure as claimed in claim 1, further comprising forming an interfacial layer on the semiconductor strip by oxidizing a surface portion of the semiconductor strip before the gate dielectric layer is formed.

3. The method for forming a semiconductor device structure as claimed in claim 1, further comprising removing the inhibition layer after the gate dielectric layer is formed and before the metal gate electrode is formed.

4. The method for forming a semiconductor device structure as claimed in claim 1, wherein the formation of the inhibition layer comprises:
   forming an initiator layer on the interior surface of the spacer element, wherein the initiator layer selectively bonds to the interior surface of the spacer element;
   introducing monomer on the initiator layer to grow an inhibition material on the initiator layer through a polymerization reaction; and
   terminating the growth of the inhibition material, wherein the inhibition material that is grown forms the inhibition layer.

5. The method for forming a semiconductor device structure as claimed in claim 4, further comprising forming an interfacial layer on the semiconductor strip after the inhibition layer is formed and before the gate dielectric layer is formed.

6. The method for forming a semiconductor device structure as claimed in claim 4, further comprising forming an interfacial layer on the semiconductor strip before the gate dielectric layer is formed, wherein the interfacial layer is formed after the monomer is introduced and before the growth of the inhibition material is terminated.

7. The method for forming a semiconductor device structure as claimed in claim 4, wherein the initiator layer comprises at least one functional group, and the at least one functional group comprises silane groups, hydroxyl groups, amine groups, or a combination thereof.

8. The method for forming a semiconductor device structure as claimed in claim 1, wherein the formation of the inhibition layer comprises:
  forming an inhibition material layer on the interior surface of the spacer element, wherein the inhibition material layer selectively bonds to the interior surface of the spacer element; and
  inducing cross-linking of molecules in the inhibition material layer to form the inhibition layer.

9. The method for forming a semiconductor device structure as claimed in claim 8, wherein the cross-linking of the molecules in the inhibition material layer is introduced by an ultraviolet curing operation, a plasma treatment operation, a thermal operation, or a combination thereof.

10. The method for forming a semiconductor device structure as claimed in claim 1, further comprising:
  forming a fin structure over the semiconductor substrate before the dummy gate stack is formed, wherein the fin structure comprises a stack of a first semiconductor material and a second semiconductor material, and the recess exposes a portion of the first semiconductor material and a portion of the second semiconductor material after the dummy gate stack is removed; and
  removing the portion of the first semiconductor material exposed by the recess, wherein the second semiconductor material that is remaining in the recess forms the semiconductor strip, and the semiconductor strip is separated from the semiconductor substrate by a portion of the recess.

11. A method for forming a semiconductor device structure, comprising:
  forming a dummy gate stack over a semiconductor substrate;
  forming a spacer element over a sidewall of the dummy gate stack;
  removing the dummy gate stack to form a recess exposing at least one channel structure;
  forming an inhibition layer along an interior surface of the spacer element after forming the spacer element, wherein the inhibition layer fully covers the interior surface of the spacer element, and wherein a main portion of the at least one channel structure is not covered by the inhibition layer, and the formation of the inhibition layer comprises:
    forming an initiator layer on the interior surface of the spacer element, wherein the initiator layer selectively bonds to the interior surface of the spacer element;
    introducing monomer on the initiator layer to grow an inhibition material on the initiator layer through a polymerization reaction; and
    terminating the growth of the inhibition material, wherein the inhibition material that is grown forms the inhibition layer;
  selectively forming a gate dielectric layer to wrap around the main portion of the at least one channel structure; and
  forming a metal gate electrode over the gate dielectric layer.

12. The method for forming a semiconductor device structure as claimed in claim 11, further comprising forming an interfacial layer on the at least one channel structure before the gate dielectric layer is formed.

13. The method for forming a semiconductor device structure as claimed in claim 12, wherein the interfacial layer is formed during the formation of the inhibition layer.

14. The method for forming a semiconductor device structure as claimed in claim 11, further comprising removing the inhibition layer after the gate dielectric layer is formed and before the metal gate electrode is formed.

15. The method for forming a semiconductor device structure as claimed in claim 11, wherein the initiator layer comprises at least one functional group, and the at least one functional group comprises silane groups, hydroxyl groups, amine groups, or a combination thereof.

16. A method for forming a semiconductor device structure, comprising:
  forming a dummy gate stack over a semiconductor substrate;
  forming a spacer element over a sidewall of the dummy gate stack;
  removing the dummy gate stack to form a recess exposing a channel structure and an interior surface of the spacer element;
  after forming the spacer element, selectively forming an inhibition layer along the interior surface of the spacer element to cover an entirety of the interior surface of the spacer element, wherein the inhibition layer substantially not bonds with the channel structure;
  forming a gate dielectric layer to wrap around the channel structure, wherein gate dielectric layer substantially not bonds to the inhibition layer; and
  forming a metal gate electrode over the gate dielectric layer.

17. The method for forming a semiconductor device structure as claimed in claim 16, wherein the formation of the inhibition layer comprises:
  forming an initiator layer on the interior surface of the spacer element, wherein the initiator layer selectively bonds to the interior surface of the spacer element;
  introducing monomer on the initiator layer to grow an inhibition material on the initiator layer; and
  terminating the growth of the inhibition material, wherein the inhibition material that is grown forms the inhibition layer.

18. The method for forming a semiconductor device structure as claimed in claim 17, further comprising forming an interfacial layer on the channel structure before the gate dielectric layer is formed, wherein the interfacial layer is formed after the monomer is introduced and before the growth of the inhibition material is terminated.

19. The method for forming a semiconductor device structure as claimed in claim 16, wherein the formation of the inhibition layer comprises:
  forming an inhibition material layer on the interior surface of the spacer element, wherein the inhibition material layer selectively bonds to the interior surface of the spacer element; and
  inducing cross-linking of molecules in the inhibition material layer to form the inhibition layer.

20. The method for forming a semiconductor device structure as claimed in claim 16, wherein the metal gate electrode is formed to have a work function layer, and a portion of the work function layer is between the gate dielectric layer and the spacer element.

* * * * *